United States Patent
Tamada et al.

(10) Patent No.: US 10,444,317 B2
(45) Date of Patent: Oct. 15, 2019

(54) MAGNETIC RESONANCE IMAGING APPARATUS AND MEDICAL PROCESSING APPARATUS

(71) Applicant: Canon Medical Systems Corporation, Otawara-shi (JP)

(72) Inventors: Daiki Tamada, Nakakoma (JP); Takahiro Tamura, Nasushiobara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 8 days.

(21) Appl. No.: 15/940,188

(22) Filed: Mar. 29, 2018

(65) Prior Publication Data

US 2018/0284212 A1    Oct. 4, 2018

(30) Foreign Application Priority Data

Mar. 29, 2017  (JP) .................. 2017-065511

(51) Int. Cl.
*G01R 33/565* (2006.01)
*G01R 33/48* (2006.01)

(52) U.S. Cl.
CPC ... *G01R 33/56572* (2013.01); *G01R 33/4824* (2013.01)

(58) Field of Classification Search
CPC .............. G01R 33/4824; G01R 33/56572
See application file for complete search history.

(56) References Cited

U.S. PATENT DOCUMENTS

| | | |
|---|---|---|
| 7,098,662 B2 | 8/2006 | Hinks et al. |
| 8,907,672 B2* | 12/2014 | Hori ............... G01R 33/3852 324/309 |
| 2010/0141253 A1 | 6/2010 | Takizawa et al. |
| 2013/0207654 A1* | 8/2013 | Takizawa ........ G01R 33/56572 324/312 |
| 2014/0125333 A1* | 5/2014 | Hanada ........... G01R 33/56518 324/307 |

FOREIGN PATENT DOCUMENTS

JP    2013-46837    3/2013

* cited by examiner

*Primary Examiner* — Gregory H Curran
(74) *Attorney, Agent, or Firm* — Oblon, McClelland, Maier & Neustadt, L.L.P.

(57) ABSTRACT

According to one embodiment, an MRI apparatus includes sequence control circuitry that performs first scanning and second scanning along mutually opposite radial directions in k-space, crossing over a k-space origin, and performs third scanning, and processing circuitry that generates first and second projection images by respectively applying a one-dimensional Fourier transform for the directions to first and second MR signals respectively acquired by the first and second scanning, determines correction coefficients related to transient response characteristics of a readout gradient magnetic field by a calculating process to reduce a difference between the first and second projection images, and generates a corrected image in which the transient response characteristics are corrected using the correction coefficients and MR signals acquired by the third scanning.

11 Claims, 11 Drawing Sheets

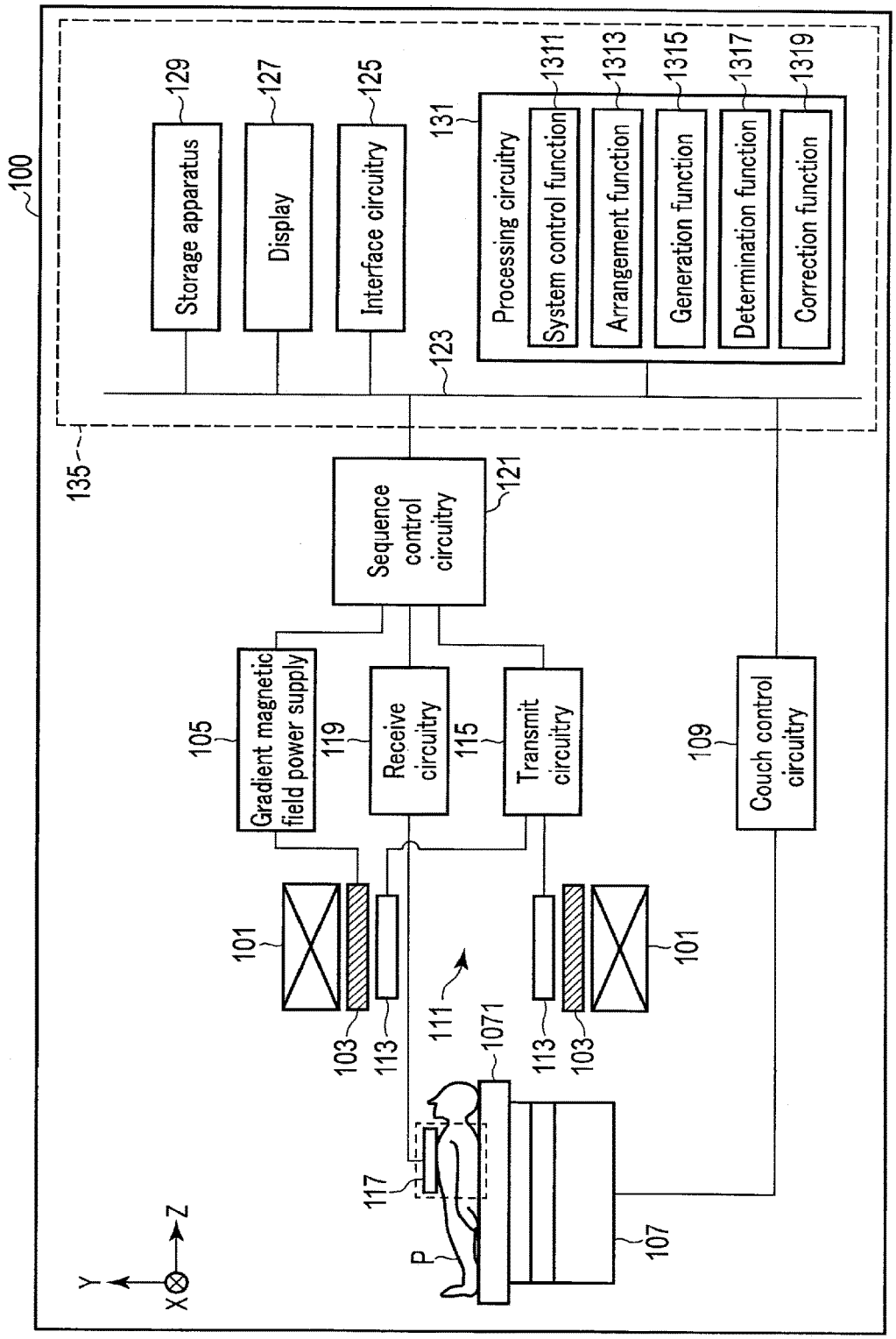
F I G. 1

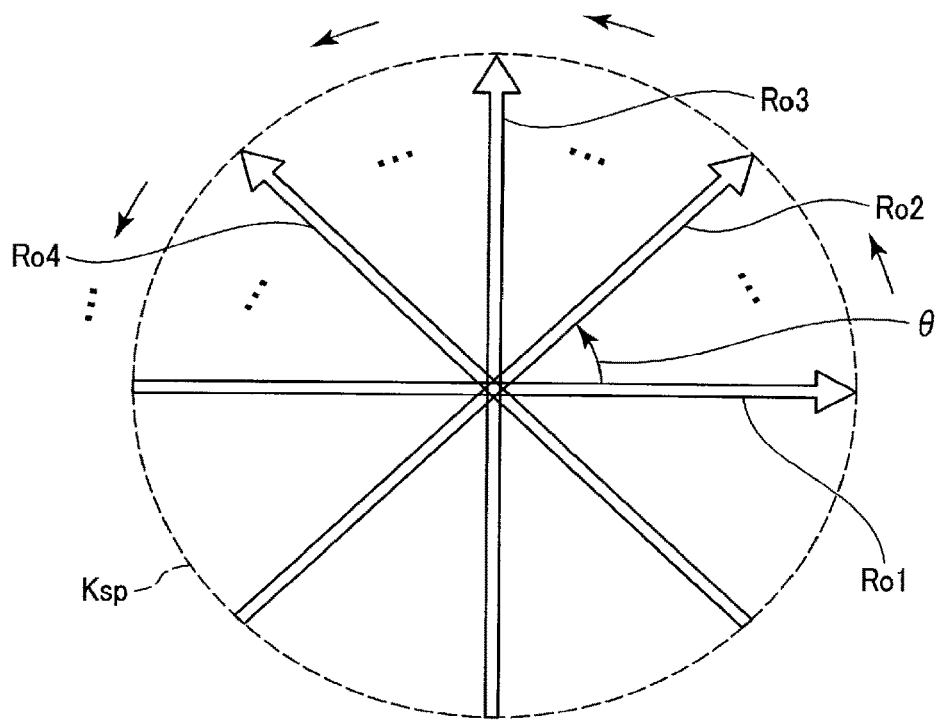
F I G. 2
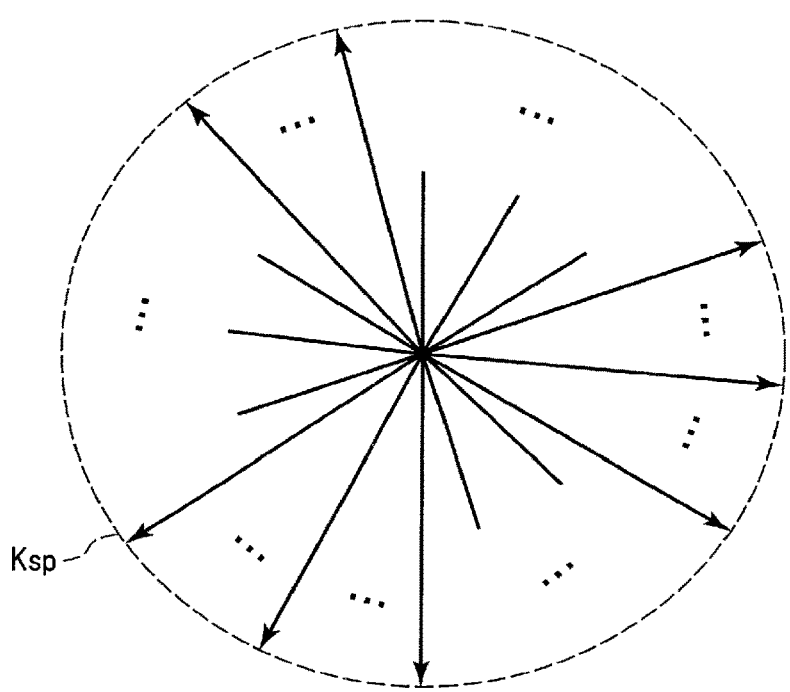
F I G. 3

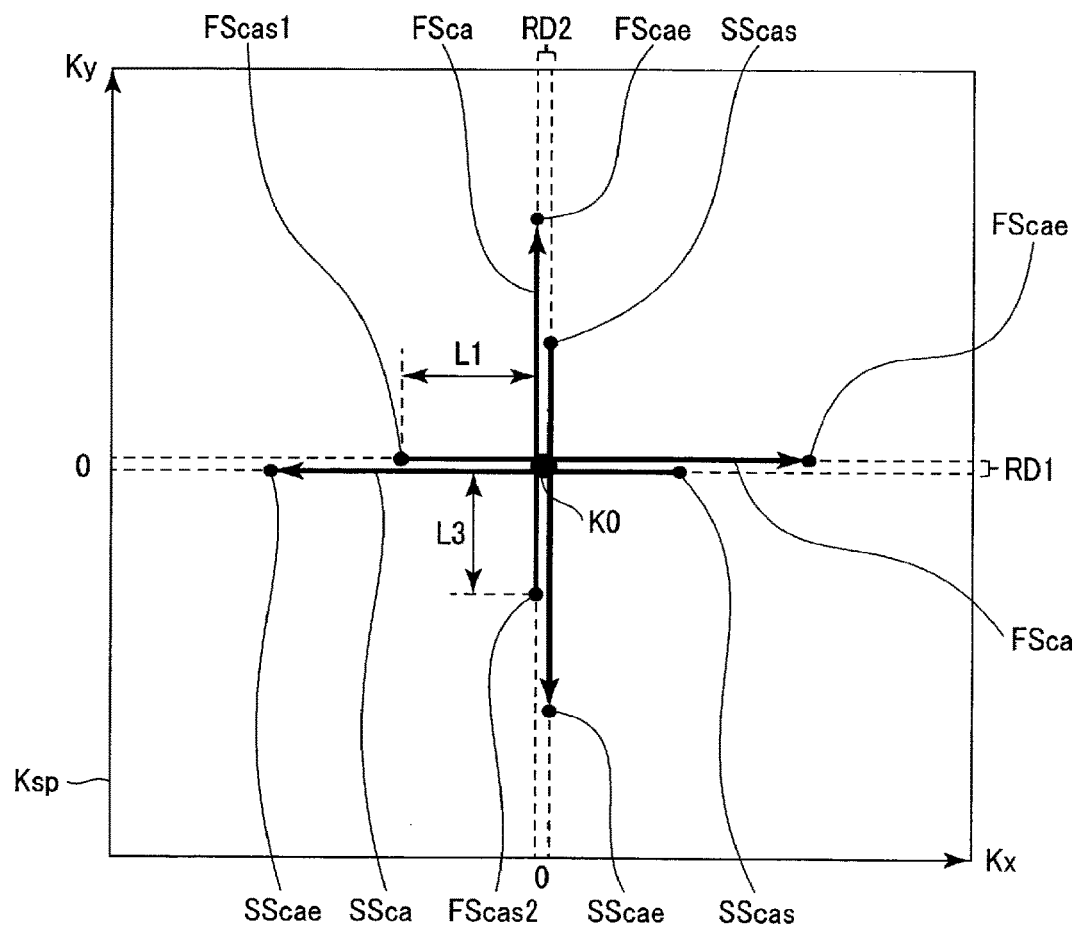
F I G. 12

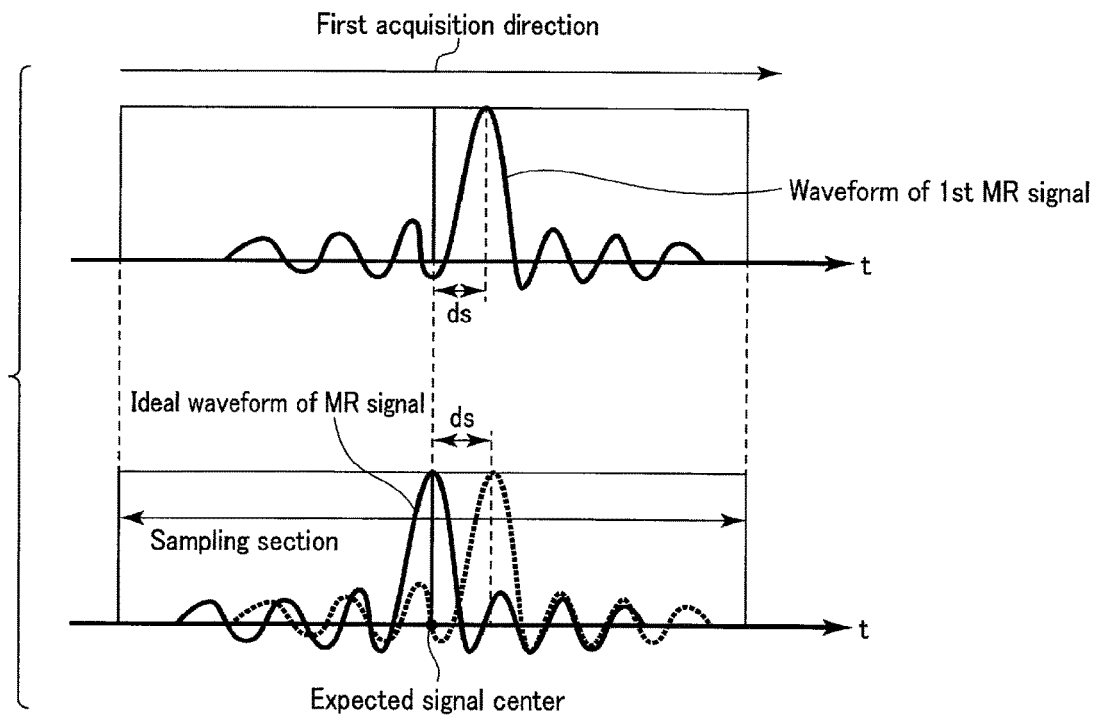
F I G. 14
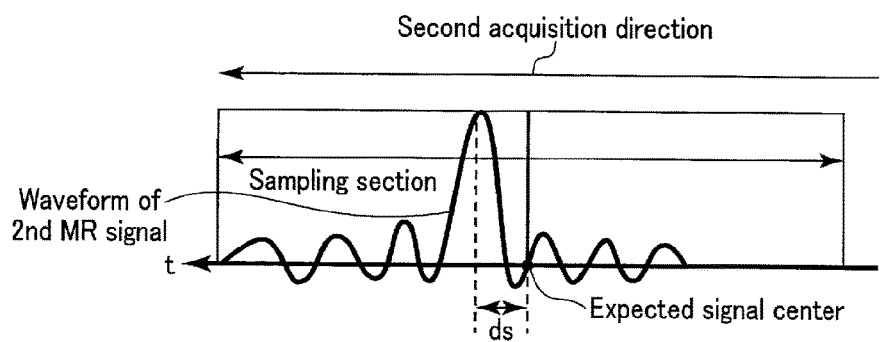
F I G. 15

US 10,444,317 B2

MAGNETIC RESONANCE IMAGING APPARATUS AND MEDICAL PROCESSING APPARATUS

CROSS-REFERENCE TO RELATED APPLICATIONS

This application is based upon and claims the benefit of priority from the prior Japanese Patent Application No. 2017-065511, filed Mar. 29, 2017, the entire contents of which are incorporated herein by reference.

FIELD

Embodiments described herein relate generally to a magnetic resonance imaging apparatus and a medical processing apparatus.

BACKGROUND

A conventional magnetic resonance imaging apparatus applies a readout gradient magnetic field to a gradient coil when acquiring magnetic resonance signals. A readout gradient magnetic field needs to be applied to a gradient coil at a constant intensity. However, depending on a transient response from the gradient coil, a waveform of the readout gradient magnetic field may be distorted. In this case, a phase of an acquired magnetic resonance signal (a phase of a nuclear magnetization of spin) may be distorted; in other words, a coordinate point of a magnetic resonance signal that is arranged in k-space may be shifted.

For example, radial scanning is known as a scanning method that has robustness against subject's movements. Magnetic resonance signals in the radial scanning is, however, susceptible to phase distortion, because magnetic resonance signals are acquired from a low-frequency region in the k-space with the radial scanning.

As a method of solving such phase distortion, a method of correcting phase distortion using pre-scanning and a method of calibrating phase distortion when a magnetic resonance imaging apparatus is installed, are known.

BRIEF DESCRIPTION OF THE DRAWINGS

FIG. 1 is a diagram showing an example of a configuration of a magnetic resonance imaging apparatus according to an embodiment.

FIG. 2 is a diagram showing an example of MR signals arranged in k-space in the embodiment.

FIG. 3 is a diagram showing an example of radial acquisition performed at asymmetrical angles from a low-frequency region of k-space.

FIG. 12 is a diagram showing an example of tracks of acquisition in the first scanning and the second scanning in each of the axes ky=0 and kx=0 as two radial directions in the second applied example of the embodiment.

FIG. 14 is a diagram showing an example of a waveform of a first MR signal related to the first scanning and an ideal waveform of a MR signal in a sampling section in the second applied example of the embodiment.

FIG. 15 is a diagram showing an example of a waveform of a second MR signal related to the second scanning in a sampling section in the second applied example of the embodiment.

DETAILED DESCRIPTION

Figure 4:
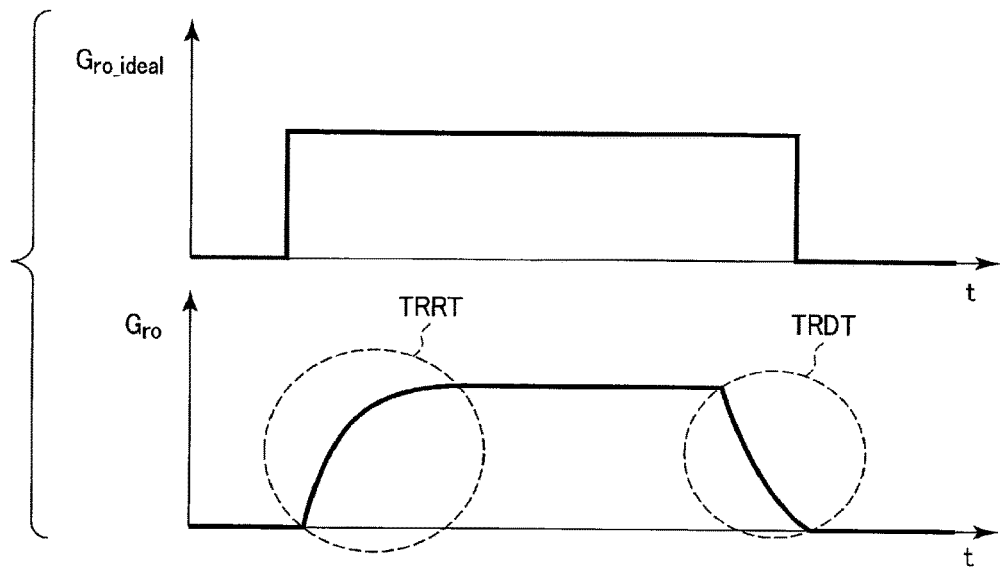
FIG. 4 is a diagram showing an example of a waveform of an ideal intensity of a readout gradient magnetic field, and a waveform of an intensity of a readout gradient magnetic field that is actually generated in the embodiment.

In general, according to one embodiment, a magnetic resonance imaging apparatus includes sequence control circuitry and processing circuitry.

The sequence control circuitry performs first scanning in a first acquisition direction along one radial direction in k-space, crossing over an origin in the k-space. The sequence control circuitry performs second scanning in a second acquisition direction opposite to the first acquisition direction along the radial direction, crossing over the origin. The sequence control circuitry performs third scanning related to filling of magnetic resonance signals in the k-space.

The processing circuitry generates a first projection image by applying a one-dimensional Fourier transform with respect to the radial direction to a first magnetic resonance signal acquired by the first scanning. The processing circuitry generates a second projection image by applying the one-dimensional Fourier transform to a second magnetic resonance signal acquired by the second scanning. The processing circuitry determines correction coefficients related to transient response characteristics of a readout gradient magnetic field by a calculating process to reduce a difference between the first projection image and the second projection image. The processing circuitry generates a corrected image in which the transient response characteristics are corrected using the correction coefficients and the magnetic resonance signal acquired by the third scanning.

The magnetic resonance imaging apparatus according to the present embodiment will be described with reference to the accompanying drawings. In the description below, structural elements having substantially the same functions and configurations will be denoted by the same reference symbols, and a repetitive description of such elements will be given only where necessary.

The configuration of the magnetic resonance imaging (MRI) apparatus according to the present embodiment is described with reference to FIG. 1. FIG. 1 is a diagram showing the configuration of the MRI apparatus 100 according to the embodiment. As shown in FIG. 1, the MRI apparatus 100 according to the present embodiment includes a static magnetic field magnet 101, a gradient coil 103, a gradient magnetic field power supply 105, a couch 107, couch control circuitry 109, a transmit coil 113, transmit circuitry 115 (transmit unit), a receive coil 117, receive circuitry 119 (receive unit), sequence control circuitry 121 (sequence control unit), a bus 123, interface circuitry 125 (input unit), a display 127 (display unit), a storage apparatus 129 (storage unit), and processing circuitry 131 (processing unit). The MRI apparatus 100 may have a hollow, cylindrical-shaped shim coil provided between the static magnetic field magnet 101 and the gradient coil 103.

The static magnetic field magnet 101 is a magnet formed in a hollow, cylindrical shape, and generates a uniform static magnetic field in its inner space. As the static magnetic field magnet 101, an superconductive magnetic is used, for example.

The gradient coil 103 is a hollow, cylindrical-shaped coil, and it is disposed inside the static magnetic field magnet 101. The gradient coil 103 is formed by combining three coils respectively corresponding to the X-, Y-, and Z-axes which are orthogonal to each other. An Z-axis direction is defined as the same as the direction of the static magnetic field. In addition, a Y-axis direction is a vertical direction, and an X-axis direction is a direction perpendicular to each of the Z-axis and the Y-axis. These three coils in the gradient coil 103 are separately supplied with a current from the gradient magnetic field power supply 105 and respectively generate gradient magnetic fields in which magnetic field intensity changes along each of the X-, Y-, and Z-axes.

Herein, the gradient magnetic fields of the X-, Y-, and Z-axes that are generated by the gradient coil 103 respectively correspond to, for example, a gradient magnetic field for slice selection, a gradient magnetic field for phase encoding, and a gradient magnetic field for frequency encoding (also referred to as a readout gradient magnetic field). The gradient magnetic field for slice selection is used to desirably determine an imaging slice. The gradient magnetic field for phase encoding is used to change a phase of a magnetic resonance (MR) signal in accordance with a spatial position. The gradient magnetic field for frequency encoding is used to change a frequency of a MR signal in accordance with a spatial position.

The gradient magnetic field power supply 105 is a power supplying apparatus that supplies a current to the gradient coil 103 by the control of the sequence control circuitry 121.

The couch 107 is an apparatus having the couch top 1071 on which a subject P is laid. The couch 107 inserts the couch top 1071 on which the subject P is laid into the bore 111 under the control of the couch control circuitry 109. Normally, the couch 107 is installed in an examination room where the MRI apparatus 100 is installed, in such a manner that the longitudinal axis of the couch 107 is parallel to the center axis of the static magnetic field magnet 101.

The couch control circuitry 109 is circuitry for controlling the couch 107, and is realized by a processor, for example. The couch control circuitry 109 drives the couch 107 in accordance with an operator's instruction via the interface circuitry 125 to move the couch top 1071 in a longitudinal direction and a vertical direction.

The transmit coil 113 is a radio frequency (RF) coil located inside the gradient coil 103. Upon being supplied with a high-frequency pulse (RF pulse) from the transmit circuitry 115, the transmit coil 113 generates a transmit RF wave that corresponds to a high-frequency magnetic field. The transmit coil is a whole body (WE) coil, for example.

The WB coil may be used as a transmit/receive coil. A cylindrical RF shield is arranged between the WB coil and the gradient coil 103 to magnetically separate these coils.

The transmit circuitry 115 supplies a high-frequency pulse corresponding to a Larmor frequency to the transmit coil 113 by the control of the sequence control circuitry 121. Specifically, the transmit circuitry 115 includes an oscillating unit, a phase selecting unit, a frequency converting unit, an amplitude modulating unit, and a high-frequency power amplifying unit. The oscillating unit generates a high-frequency signal of a resonance frequency unique to target atomic nuclei in a static magnetic field. The phase selecting unit selects a phase of the high-frequency signal. The frequency converting unit converts a frequency of the high-frequency signal that is output from the phase selecting unit. The amplitude modulating unit modulates an amplitude of the high-frequency signal that is output from the frequency converting unit in accordance with a sinc function. The high-frequency power amplifying unit amplifies the high-frequency signal that is output from the amplitude modulating unit. As a result of the operations of those units, the transmit circuitry 115 outputs a high-frequency pulse corresponding to a Larmor frequency to the transmit coil 113.

The receive coil 117 is an RF coil located inside of the gradient coil 103, and receives an MR signal emitted from a subject P by the high-frequency magnetic field. The receive coil 117 outputs the received MR signal to the receive circuitry 119. The receive coil 117 is, for example, a coil array having one or more coils, typically a number of coils. In FIG. 1, the transmit coil 113 and the receive coil 117 are illustrated as separate RF coils; however, the transmit coil 113 and the receive coil 117 may be realized by an integrated transmit/receive coil. The transmit/receive coil is, for example, a local transmit/receive RF coil, such as a head coil, to serve an imaging target in a subject P.

The receive circuitry 119 generates, under the control of the sequence control circuitry 121, a digital MR signal (MR data), which is digitized complex number data, based on the MR signal that is output from the receive coil 117. Specifically, the receive circuitry 119 first performs various types of signal processing, such as pre-amplification, intermediate frequency conversion, phase detection, low frequency amplification, and filtering, to the MR signal that is output from the receive coil 117, and then performs analog-to-digital (A/D) conversion to data to which the variety of signal processing is performed. The receive circuitry 119 performs sampling to the A/D converted data. A digital MR signal is thereby generated by the receive circuitry 119. The digital MR signal corresponds to each of a plurality of sampling points related to sampling of the MR signals that are output from the receive coil 117. The receive circuitry 119 outputs the generated MR signal to the sequence control circuitry 121. The MR signal generated by the receive circuitry 119 may be called raw data.

The sequence control circuitry 121 controls the gradient magnetic field power supply 105, the transmit circuitry 115, and the receive circuitry 119 in accordance with an imaging protocol that is output from the processing circuitry 131, and performs imaging on a subject P. An imaging protocol has different pulse sequences in accordance with a type of examination. In an imaging protocol, defined are a value of a current supplied to the gradient coil 103 by the gradient magnetic field power supply 105, timing of supplying a current to the gradient coil 103 by the gradient magnetic field power supply 105, a magnitude of an RF pulse supplied to the transmit RF coil 113 by the transmit circuitry 115, timing of supplying an RF pulse to the transmit RF coil 113 by the transmit circuitry 115, timing of detecting an MR signal by the receive circuitry 117, and the like. An amplitude of a current supplied to the gradient coil 103 from the gradient magnetic field power supply 105 corresponds to a waveform of a readout gradient magnetic field in accordance with a pulse sequence.

For example, if a pulse sequence is radial acquisition (radial scanning) by which MR signals are acquired in radial directions (spokes) in k-space, the sequence control circuitry 121 controls the gradient magnetic field power supply 105 so as to simultaneously generate a gradient magnetic field for phase encoding and a gradient magnetic field for frequency encoding as a readout gradient magnetic field. In addition, the sequence control circuitry 121 controls the gradient magnetic field power supply 105 in such a manner that an intensity of the gradient magnetic field for phase encoding and an intensity of the gradient magnetic field for frequency encoding are changed every time a high-frequency pulse is applied to the transmit coil 113. Upon generation of a readout gradient magnetic field, the sequence control circuitry 121 controls the receive circuitry 119 to receive an MR signal. The sequence control circuitry 121 outputs the MR signal that is output from the receive circuitry 119 along with a radial direction and an intensity of the readout gradient magnetic field to the processing circuitry 131 and the storage apparatus 129.

The bus 123 is a transmit path for transmitting data among the interface circuitry 125, the display 127, the storage apparatus 129, and the processing circuitry 131. Various types of living body signal measuring devices and external storage devices may be connected to the bus 123 via a network, etc., as needed.

The interface circuitry 125 is circuitry for receiving various instructions and information that are input from an operator. The apparatus 125 is circuitry for a pointing device, such as a mouse, or for an input device, such as a keyboard, etc. The interface circuit 125 is not limited to circuitry for physical operation members such as a mouse and a keyboard. The interface circuitry 125 also includes, for example, electric signal processing circuitry that receives an electric signal corresponding to an input operation through an external input device provided separately from the present MRI apparatus 100 and outputs the received electric signal to different circuitry.

Under the control of the control function 1311 in the processing circuitry 131, the display 127 displays various types of information, such as an MR image reconstructed by the generation function 1315. The display device 127 is, for example, a CRT display, a liquid crystal display, an organic EL display, an LED display, a plasma display, a monitor, or any other display known in this technical field.

The storage apparatus 129 stores MR signals that are arranged (filled) in k-space through the arrangement function 1313, and image data that is generated by the generation function 1315, and other data. The storage circuitry 129 stores various types of imaging protocols, conditions for imaging, including a plurality of imaging parameters that define imaging protocols. The storage apparatus 129 stores programs corresponding to various functions executed by the processing circuitry 131. For example, the storage apparatus 129 is a semiconductor memory element, such as a RAM (Random Access Memory) and a flash memory, a hard disk drive, a solid state drive, or an optical disk, etc. The storage apparatus 129 may be a drive, etc. configured to read and write various kinds of information with respect to a portable storage medium such as a CD-ROM drive, a DVD drive, or a flash memory, etc.

The processing circuitry 131 includes a processor (not-shown in the drawings), and a memory (not-shown in the drawings), such as a ROM or a RAM, as hardware resources, to control the MRI apparatus 100 integrally. The processing circuitry 131 includes a system control function 1311, an arrangement function 1313, a generation function 1315, a determination function 1317, and a correction function 1319. The system control function 1311, the arrangement function 1313, the generation function 1315, the determination function 1317, and the correction function 1319 are stored in the storage apparatus 129 in a form of a computer-executable program. The processing circuitry 131 is a processor which reads a program corresponding to each function from the memory apparatus 129 and executes the program to realize the function corresponding to the program. In other words, the processing circuitry 131 in a state where each of the programs is read has each of the functions shown in the processing circuitry 131 of FIG. 1.

It was described with reference to FIG. 1 that those functions are realized in single processing circuitry 131; however, a plurality of independent processors may be combined to constitute the processing circuitry 131, and the functions may be realized by a program by each of the processors . In other words, each of the above-mentioned functions may be configured as a program, and single processing circuitry executes each program, or a specific function may be implemented in exclusive, independent program-execution circuitry. The system control function 1311, the arrangement function 1313, the generation function 1315, the determination function 1317, and the correction function 1319 of the processing circuitry 131 are examples of a system controlling unit, an arranging unit, a generating unit, a determining unit, and a correcting unit, respectively.

The term "processor" used in the above description means, for example, a CPU (Central Processing Unit) , a GPU (Graphical Processing Unit), or circuitry such as an ASIC (Application Specific Integrated Circuit), or a programmable logic device (e.g. SPLD (Simple Programmable Logic Device), CPLD (Complex Programmable Logic Device), or a FPGA (Field Programmable Gate Array)).

The processor realizes its function by reading and executing a program stored in the storage apparatus 129. Instead of storing a program on the storage apparatus 129, the program may be directly integrated into the circuitry of the processor. In this case, the function is realized by reading and executing the program integrated into the circuitry. Similarly, each of the couch control circuitry 109, the transmit circuitry 115, the receive circuitry 119, and the sequence control circuitry 121, etc., are also configured as an electronic circuit, such as the above processor.

The processing circuitry 131 integrally controls the MRI apparatus 100 by the system control function 1311. Specifically, the processing circuitry 131 reads a system control program stored in the storage apparatus 129 and expands it in the memory, and controls each circuitry of the MRI apparatus 100 in accordance with the expanded system control program. For example, by the system control function 1311, the processing circuitry 131 reads an imaging protocol from the storage apparatus 129 based on conditions for imaging that are input by an operator through the interface circuitry 125. The processing circuitry 131 may also generate an imaging protocol based on conditions for imaging. The processing circuitry 131 transmits the imaging protocol to the sequence control circuitry 121 to control imaging of a subject P.

By the arrangement function 1313, the processing circuitry 131 arranges MR Signals in k-space in accordance with an intensity of the readout gradient magnetic field. In other words, the processing circuitry 131 arranges (fills) MR signals respectively corresponding to the sampling points in k-space, in accordance with an intensity of the readout gradient magnetic field. For example, if MR signals are acquired by radial acquisition, the processing circuitry 131 arranges, in a region corresponding to k-space in a memory installed in the processing circuitry 131 itself or the storage apparatus 129, the MR signals in a radial direction at an interval corresponding to an intensity of a readout gradient magnetic field.

FIG. 2 is a diagram showing an example of MR signals arranged in k-space Ksp. As shown in FIG. 2, MR signals are acquired while an angle e in a radial direction in k-space Ksp is changed in the order of Ro1, Ro2, Ro3, and Ro4, for example, and the MR signals are arranged in k-space Ksp. The radial acquisition is not limited to acquisition at a uniform angle θ from the periphery of k-space Ksp as shown in FIG. 2; the radial acquisition may be performed from a low-frequency region in k-space Ksp to shorten a time required for imaging. The angle θ in the radial acquisition is not limited to a uniform angle; it may be a non-uniform angle.

FIG. 3 is a diagram showing an example of radial acquisition performed at non-uniform angles θ from a low-frequency region in k-space Ksp. As shown in FIG. 3, the MR signals are arranged in radial directions in non-uniform angles θ from the low-frequency region in k-space Ksp.

By the generation function 1315, the processing circuitry 131 performs a Fourier transform on the MR signals arranged in k-space to generate an MR image. The processing circuitry 131 outputs an MR image to the display 127 and the storage apparatus 129. The determination function 1317 and the correction function 1319 that are realized by the processing circuitry 131 will be described later in detail.

The overall configuration of the MRI apparatus 100 according to the present embodiment has been described above. Hereinafter, first, an influence on an MR image caused by distortion of a waveform indicating an intensity of a readout gradient magnetic field will be explained. The details of the present embodiment will be explained thereafter. To make the explanation specific, suppose MR signals are acquired through radial acquisition in the explanation hereafter. Acquisition of MR signals in the present embodiment is not limited to radial acquisition; a given acquisition method, such as Cartesian acquisition or spiral-like non-Cartesian acquisition, may be adopted.

A waveform of an intensity of the readout gradient magnetic field is distorted by a transient response of the gradient coil 103. FIG. 4 is a diagram showing an example of a waveform of an ideal intensity $G_{ro\_ideal}$ of a readout gradient magnetic field, and a waveform of an intensity $G_{ro}$ of a readout gradient magnetic field that is actually generated. In FIG. 4, changes in the intensity $G_{ro}$ in a rise period TRRT of the intensity $G_{ro}$ and a fall period TRDT of the intensity $G_{ro}$ indicate transient response characteristics of the readout gradient magnetic field. As shown in FIG. 4, in the rise period TRRT of the intensity $G_{ro}$ and the fall period TRDT of the intensity $G_{ro}$, the waveform of the intensity of $G_{ro}$ is distorted, compared to the waveform of the ideal intensity $G_{ro\_ideal}$. The distortion of the waveform of the intensity $G_{ro}$ affects the positions of the MR signals arranged in the readout direction in k-space, in other words, the coordinates in k-space corresponding to the sampling points.

Figure 5:
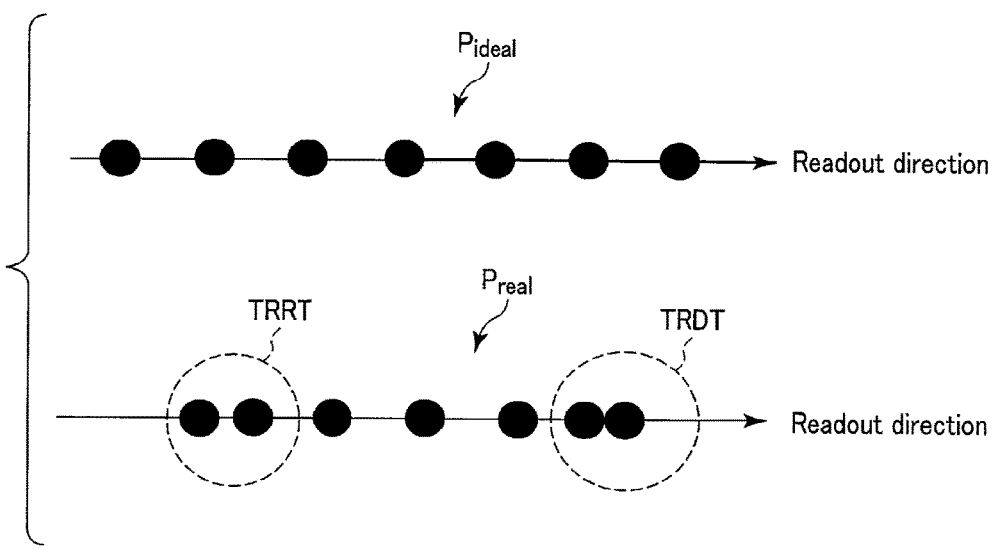
FIG. 5 is a diagram showing an example of an influence on sampling points in a readout direction in k-space caused by a distorted waveform of an intensity of a readout gradient magnetic field in the embodiment.

FIG. 5 is a diagram showing an example of how sampling points in a readout direction in k-space are affected by a distorted waveform of the intensity $G_{ro}$ of a readout gradient magnetic field. As shown in FIG. 5, the positions $P_{ideal}$ of the MR signals based on the waveform of the ideal intensity $G_{ro\_ideal}$ are evenly spaced along the readout direction. In contrast, as shown in FIG. 5, the positions P the MR signal based on the waveform of the intensity $G_{ro}$ of the readout gradient magnetic field that is actually generated are unevenly spaced in the rise period TRRT of the intensity $G_{ro}$ and in the fall period TRDT of the intensity $G_{ro}$. Shifted positions (coordinates) of MR signals in k-space may cause artifacts. In the following, constituent elements and operations related to determination of transient response characteristics of a readout gradient magnetic field and generation of MR images in which artifacts are reduced using determined transient response characteristics will be described.

The storage apparatus 129 stores a waveform of a readout gradient magnetic field in accordance with a pulse sequence. The storage apparatus 129 stores an initial condition of transient response characteristics based on a transient response of at least one gradient coil 103 related to generation of a readout gradient magnetic field and a waveform of the readout gradient magnetic field. The transient response characteristics of the readout gradient magnetic field in the rise period TRRT of the intensity $G_{ro}$ is given by the following expression (1) where time in the rise period TRRT is t (0≤t<a rise finish time), using correction coefficients a and T. The correction coefficients a and T are determined by the determination function 1317.

$$G_{ro} = a \times (1 - \exp(-t/T)) \qquad (1)$$

The transient response characteristics of the readout gradient magnetic field in the rise period TRDT of the intensity $G_{ro}$ can be given by the following expression (2), where time in the fall period TRDT is t (a time when applying a readout gradient magnetic field is finished<t≤a time when a readout gradient magnetic field becomes zero).

$$G_{ro} = a \times \exp(-t/T) \qquad (2)$$

The initial condition in the rise period TRRT (hereinafter, the rise condition) and the initial condition in the fall period TRDT (hereinafter, the fall condition) correspond to using the intensity $G_{ro\_ini}$ in the waveform of a readout gradient magnetic field according to a pulse sequence as the correction coefficient a, and to using the time constant $T_c$ related to the transient response of at least one gradient coil 103 related to the generation of the readout gradient magnetic field as the correction coefficient T. The correction coefficients a and T used as the initial condition are not limited to the intensity $G_{ro\_ini}$ and the time constant $T_c$; rather they may be discretionarily-determined values.

The storage circuitry 129 may store a threshold used in the determination function 1317. If a pulse sequence is set in accordance with an operator's instruction, the initial condition using the intensity in accordance with the set pulse sequence and the threshold are read from the storage apparatus 129 by the processing circuitry 131. The initial condition of the transient response characteristics of a readout gradient magnetic field may be at least either one of the rise condition and the fall condition. For example, if a pulse sequence is a pulse sequence related to radial scanning like the one shown in FIG. 3, phase distortion related to a low-frequency region in k-space is a main cause for artifacts; thus, the rise condition is used as an initial condition for the transient response characteristics of the readout gradient magnetic field. Hereinafter, a case of performing radial scanning as illustrated in FIG. 3, where advantageous effects of the present embodiment becomes significant, will be explained. In this case, the rise condition and the threshold are output to the processing circuitry 131 as the initial condition of the transient response characteristics of the readout gradient magnetic field.

The processing circuitry 131 that realizes the generation function 1315 generates a first image using all the MR signals that are acquired by imaging of a subject P and arranged in k-space. Specifically, the processing circuitry 131 generates a first image using the rise condition and all the MR signals. The MR signals used for generating a first image are not limited to all the MR signals arranged in k-space. For example, the processing circuitry 131 may use MR signals arranged at first sampling points in k-space to generate a first image. In other words, to generate a first image, the processing circuitry 131 may use the initial condition of the transient response characteristics, which are based on the waveform of the readout gradient magnetic field according to the pulse sequence and a transient response of at least one gradient coil related to generation of the readout gradient magnetic field, and the MR signals arranged in the first sampling points.

Figure 6:
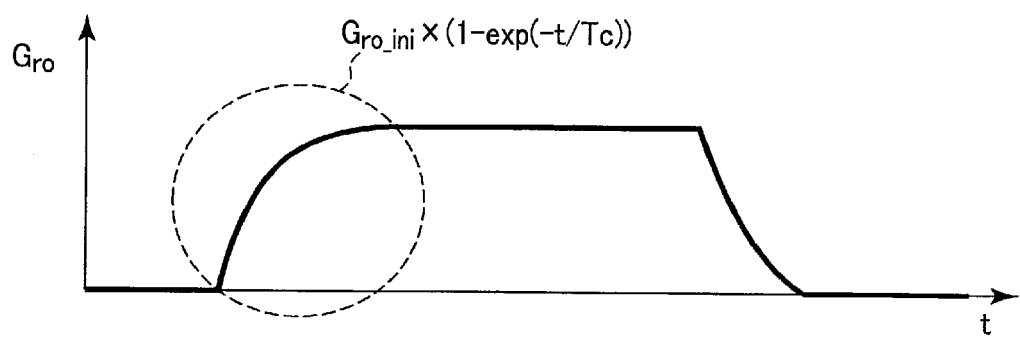
FIG. 6 is a diagram showing an example of a waveform of a readout gradient magnetic field and a rise condition indicating a change in a waveform of a readout gradient magnetic field.

FIG. 6 is a diagram showing the waveform of the readout gradient magnetic field and the rise condition indicating changes in the waveform of the readout gradient magnetic field. In the rise condition, the waveform of the intensity $G_{ro}$ in the rise period of the readout gradient magnetic field is represented by the expression shown in FIG. 6. In the expression shown in FIG. 6, the intensity $G_{ro\_ini}$ is substituted to the correction coefficient a, and the time constant $T_c$ is substituted to the correction coefficient T in the expression (1).

The processing circuitry 131 that realizes the generation function 1315 generates a second image using, among all the MR signals, some MR signals that correspond to some of the sampling points. In other words, the processing circuitry 131 generates the second image using the MR signals that correspond to fewer sampling points than the sampling points used for generating a first image. Specifically, the processing circuitry 131 that realizes the generation function 1315 specifies sampling points that have a lesser influence due to transient response characteristics on an image as some sampling points among a plurality of sampling points in k-space. Some sampling points are, for example, sampling after a predetermined length of time multiplied by a constant number, for example twice or three times of the time constant $T_c$, has elapsed after the rise starting time. The MR signals used for generating a second image are not limited to the MR signals arranged at the sampling points fewer than those used for generating a first image. For example, the processing circuitry 131 may generate a second image using the MR signals arranged at second sampling points that are of the number same as or different from the number of the first sampling points and are located differently from the first sampling points in k-space. In this case, the second sampling points are equivalent to sampling points that are less affected by the transient response characteristics.

Figure 7:
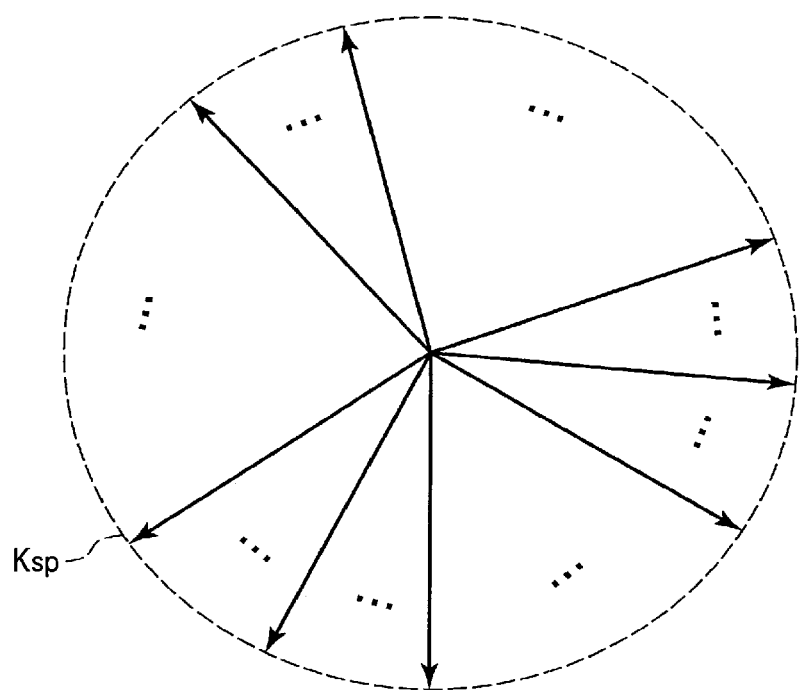
FIG. 7 is a diagram showing an example of an arrangement of some MR signals corresponding to some sampling points in k-space in the embodiment.

FIG. 7 is a diagram showing an example of an arrangement of some MR signals corresponding to some sampling points in k-space Ksp. As shown in FIG. 7, the MR signals in the rise period of the readout gradient magnetic field are removed from the MR signals arranged in the radial directions in k-space Ksp, compared to the MR signals arranged in the radial directions in k-space shown in FIG. 3. Some sampling points (second sampling points) may be, among the sampling points related to the MR signals arranged in the readout direction, sampling points included in a period except for at least one of the rise period of the intensity $G_{ro}$ and the fall period of the intensity $G_{ro}$ in the period of applying the readout gradient magnetic field. The processing circuitry 131 generates a second image, using some MR signals corresponding to the specified sampling points. The second image is equivalent to an image which is less affected by the transient response characteristics of the readout gradient magnetic field.

The processing circuitry 131 that realizes the determination function 1317 determines the correction coefficients related to the transient response characteristics of the readout gradient magnetic field by a calculating process to reduce a difference between the first image and the second image. For example, the processing circuitry 131 determines the correction coefficients a and T related to the transient response characteristics of the readout gradient magnetic field by a calculating process to minimize a difference between the first image and the second image. Specifically, the processing circuitry 131 generates a differential image by calculating a difference between the first image and the second image. Subsequently, the processing circuitry 131 calculates a square root of a sum of squares of each of a plurality of pixel values in the differential image. In other words, the processing circuitry 131 calculates a root-mean-square value as a cost function based on a plurality of pixel values in a first image and a plurality of pixel values in a second image. The processing circuitry 131 determines the correction coefficient a and the correction coefficient T so as to minimize the root-mean-square value, in other words, by a calculating process to minimize a value in the cost function. The calculating process is, for example, a quasi-Newton method related to non-linear optimization. The calculating processing is not limited to a quasi-Newton method; a given calculating processing related to non-linear optimization may be adopted. The processing circuitry 131 causes the storage apparatus 129 to store the determined correction coefficients a and T with association with the pulse sequence and the waveform of the readout gradient magnetic field.

The processing circuitry 131 that realizes the correction function 1319 generates a corrected image in which an influence of the transient response characteristics in the first image is corrected, using the correction coefficients. Specifically, the processing circuitry 131 corrects the positions of the sampling points, other than some of the sampling points in k-space, in accordance with the correction coefficients. For example, the processing circuitry 131 corrects, in k-space in accordance with the correction coefficients, positions of other sampling points which are the first sampling points except for sampling points included in a range where a first range defined by the first sampling points overlaps with a second range defined by the second sampling points. Subsequently, the processing circuitry 131 generates a corrected image, using the other MR signals at the corrected positions of the other sampling points and some of the MR signals corresponding to some of the sampling points. The processing circuitry 131 outputs the corrected image to the display 127.

If a process of generating a first image is repeated during the determination of the correction coefficients, the processing circuitry 131 that realizes the correction function 1319 may output, to the display 127, a first image that is generated at the time when the root-mean-square value becomes smaller than a threshold, or when the root-mean-square value becomes a minimum value, as a corrected image.

Furthermore, the processing circuitry 131 generates a corrected image using all the MR signals and the stored correction coefficients, if the correction coefficients that are associated with a pulse sequence and a waveform of a readout gradient magnetic field are stored in the storage apparatus 129.

(Operation)

Figure 8:
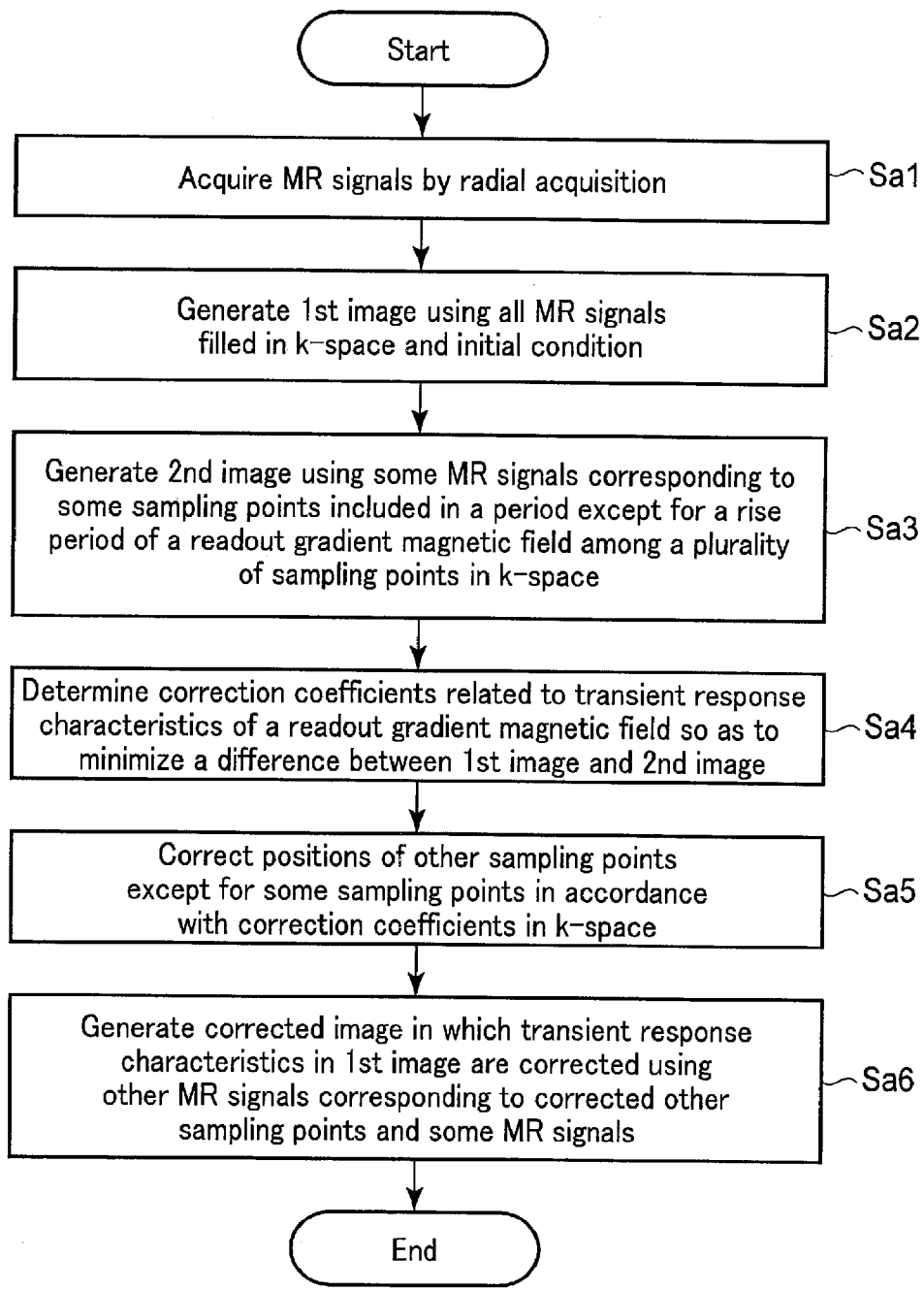
FIG. 8 is a flowchart showing an example of a process of an operation according to the embodiment.

FIG. 8 is a flowchart showing an example of a process of an operation according to the embodiment.

(Step Sa1)

An imaging protocol related to radial acquisition, for example, is determined by an operator's instruction that is input through the interface circuitry 125. MR signals are acquired by radial acquisition. If the correction coefficients a and T associated with a pulse sequence of the imaging protocol and a waveform of a readout gradient magnetic field are stored in the storage circuitry 129, the processing in step Sa5 is performed.

(Step Sa2)

A first image is generated using all the MR signals filled in k-space and the initial condition. The initial condition used for generating a first image is preferably a rise condition that is represented by the expression shown in FIG. 6. If a rise condition and a fall condition are used as the initial condition, a first image is generated using the expression (1) and the expression (2) where the intensity $G_{ro\_ini}$ and the time constant $T_c$ are respectively substituted to the correction coefficients a and T, and all the MR signals filled in k-space.

(Step Sa3)

Of a plurality of sampling points in k-space, the sampling points that have a lesser influence due to transient response characteristics on an image are specified as some sampling points. More specifically, some sampling points are, among the plurality of sampling points related to the MR signals arranged in the radial directions, sampling points included in a period of applying a readout gradient magnetic field except for the rise period TRRT of the intensity $G_{ro}$. Some sampling points correspond to, for example, the sampling points in the position $P_{real}$ of MR signals which are unevenly spaced in the readout direction as shown in FIG. 5, except for the sampling points included in the rise period TRRT. A second image is generated using some MR signals corresponding to some sampling points.

If a fall condition is used as the initial condition in addition to the rise condition, some sampling points are those included in a period except for the rise period TRRT and the fall period TRDT, among the plurality of sampling points corresponding to the MR signals arranged in the readout direction. The order of generating the first image and the second image is not limited to the above-described order; for example, a second image may be generated first, and a first image maybe generated subsequently. In this case, the order of the processing changes between step Sa2 and step Sa3.

(Step Sa4)

The correction coefficients a and T related to transient response characteristics of the readout gradient magnetic field are determined by a calculating process of minimizing a difference between the first image and the second image. Specifically, the processing circuitry 131 that realizes the determination function 1317 compares a root-mean-square value with a threshold. If the root-mean-square value is equal to or greater than the threshold, the processing circuitry 131 changes the values of the correction coefficients a and T in the rise condition, and recalculates the root-mean-square value. The processing circuitry 131 generates a first image once again, using all the MR signals arranged in k-space and the changed correction coefficients a and T, for example. The processing circuitry 131 recalculates a root-mean-square value, using the re-generated first image and second image. The processing circuitry 131 repeats updating the values of the correction coefficients a and T until when the recalculated root-mean-square value becomes smaller than the threshold. By the repeated processing by the processing circuitry 131, the processing circuitry 131 determines the correction coefficients a and T at the time when the root-mean-square value becomes smaller than the threshold as correction coefficients that realize the transient response characteristics of the readout gradient magnetic field. The processing circuitry 131 may determine the corrections coefficient a and T at the time when the root-mean-square value becomes a minimum value in the change of the corrections coefficient a and T, or at the time when the change of the root-mean-square value with reference to the change of the corrections coefficient a and T becomes zero, as correction coefficients that realize the transient response characteristics of the readout gradient magnetic field.

(Step Sa5)

In k-space, the positions of other sampling points except for some sampling points are corrected in accordance with the correction coefficients. More specifically, the processing circuitry 131 that realizes the correction function 1319 determines positions of other sampling points in the readout direction, using the determined correction coefficients a and T. The processing circuitry 131 arranges the MR signals at the determined positions in k-space. Correction of positions of other sampling points using the correction coefficients a and T, corresponds to correction of the position $P_{real}$ of the unevenly-spaced MR signals in the readout direction to the position $P_{ideal}$ of the evenly-spaced MR signals in FIG. 5. Phase distortion related to the sampling points in k-space is corrected by the processing in step Sa5.

(Step Sa6)

A corrected image in which the transient response characteristics in the first image are corrected is generated using other MR signals corresponding to the corrected other sampling points and some MR signals corresponding to some sampling points. The generated corrected image is displayed on the display 127.

According to the above-described configuration, the following advantageous effects can be obtained.

According to the magnetic resonance imaging apparatus 100 of the present embodiment, MR signals respectively corresponding to a plurality of sampling points are arranged in a readout direction of k-space in accordance with an intensity of the readout gradient magnetic field, a first image is generated using all the MR signals arranged in k-space, a second image is generated using, among all the MR signals, some MR signals corresponding to some sampling points that have a lesser influence due to transient response characteristics, correction coefficients related to transient response characteristics of the readout gradient magnetic field are determined by a calculating process to minimize a difference between the first image and the second image, and a corrected image in which influence of the transient response characteristics in the first image are corrected is generated using the correction coefficients.

According to the magnetic resonance imaging apparatus 100 of the present embodiment, a first image is generated using MR signals arranged at first sampling points in k-space, a second image is generated using MR signals arranged at the second sampling points that are of the number same as or different from the number of the first sampling points and are located differently from the first sampling points in k-space, correction coefficients related to transient response characteristics of a readout gradient magnetic field are determined by a calculating process to minimize a difference between the first image and the second image, and a corrected image in which an influence of the transient response characteristics in the first image are corrected is generated using the correction coefficients.

Thus, according to the present magnetic resonance imaging apparatus 100, it is possible to correct phase distortion using MR signals that are obtained by main scanning performed on a subject P, in other words, to perform self-calibration of phase distortion in k-space. Thus, according to the present magnetic resonance imaging apparatus 100, additional imaging, such as pre-scanning related to correction of phase distortion becomes unnecessary, and efficiency for a flow of imaging a subject P can be improved. In addition, according to the present magnetic resonance imaging apparatus 100, phase distortion can be corrected for every image reconstruction, thereby generating an image in which artifacts due to phase distortion are reduced even when calibration of phase distortion at the time of installing the apparatus was not well performed. Particularly, according to the present magnetic resonance imaging apparatus 100, in radial scanning where artifacts due to transient response characteristics of a readout gradient magnetic field become significant, an image in which artifacts due to phase distortion are effectively reduced, can be generated.

FIRST APPLIED EXAMPLE

A difference from the above embodiment is that a first projection image that does not include a transient response period of the readout gradient magnetic field, and a second projection image that includes a transient response period, are generated by first scanning and second scanning performed along one radial direction, and the correction coefficients a and T are determined so as to minimize a difference between the first projection image and the second projection image. The transient response period of the readout gradient magnetic field is a period related to at least one of the rise period TRRT of the intensity $G_{ro}$ of the readout gradient magnetic field or the fall period TRDT of the intensity $G_{ro}$ of the readout gradient magnetic field. In the following, for purposes of simplicity of explanation, the transient response period of the readout gradient magnetic field will be explained as the rise period TRRT of the intensity $G_{ro}$ of the readout gradient magnetic field. In the present applied example, the transient response period of the readout gradient magnetic field may be a fall period TRDT of the intensity $G_{ro}$ of the readout gradient magnetic field, or may be both of the rise period TRRT and the fall period TRDT.

The sequence control circuitry 121 performs first scanning and second scanning before performing main scanning, using a waveform and a bandwidth of the readout gradient magnetic field in an imaging protocol adopted in the main scanning.

Specifically, the sequence control circuitry 121 performs first scanning and second scanning in one radial direction in k-space for a subject P. The sequence control circuitry 121 performs first scanning and second scanning in such a manner that the period in which the readout gradient magnetic field in the first scanning becomes constant includes the transient response period TRRT of the readout gradient magnetic field in the second scanning. The scanning direction of the first scanning and the scanning direction of the second scanning in k-space are preferably different from each other. The sequence control circuitry 121 performs main scanning (third scanning) on a subject P after performing the first scanning and the second scanning. The first scanning and the second scanning are pre-scanning.

Figure 9:
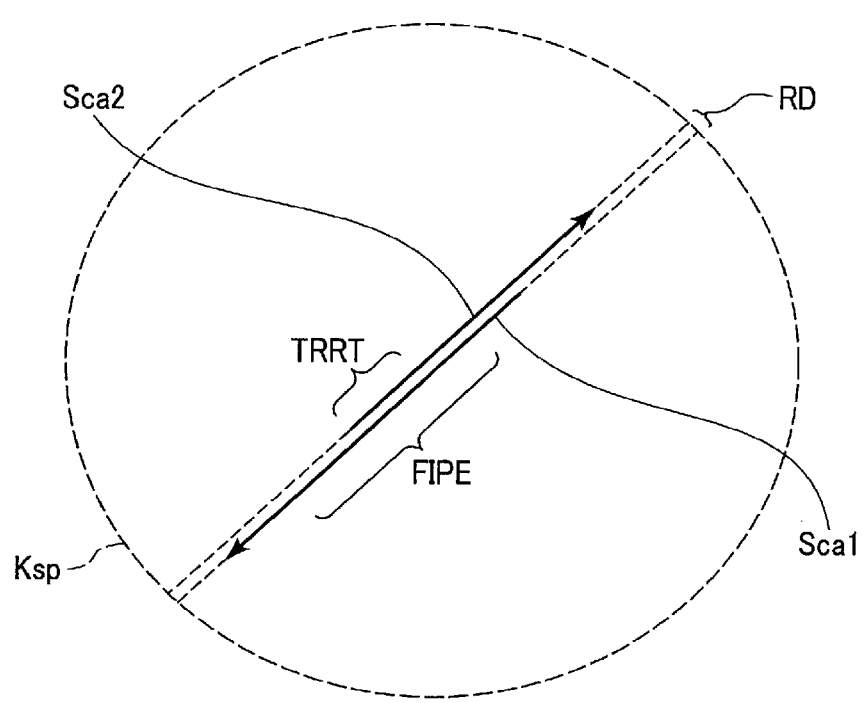
FIG. 9 is a diagram showing an example of first scanning and second scanning in k-space in a first applied example of the embodiment.

FIG. 9 is a diagram showing an example of the first scanning Sca and the second scanning Sca2 in k-space Ksp. The radial direction RD in FIG. 9 is depicted with a width for the purpose of showing the scanning directions in the first scanning Sca1 and the second scanning Sca2. As shown in FIG. 9, the first scanning Sca1 and the second scanning Sca2 are performed in mutually different directions, along one radial direction RD. As shown in FIG. 9, the transient response period TRRT of the readout gradient magnetic field in the second scanning Sca2 is included in a period FIPE where the readout gradient magnetic field is constant in the first scanning Sca1.

The receive coil 117 receives a first MR signal that is emitted from a subject P by the first scanning Sca1. The receive coil 117 receives a second MR signal that is emitted from the subject P by the second scanning Sca2. The receive coil 117 receives a third MR signal that is emitted from the subject P by the third scanning.

The receive circuitry 119 generates a digitized first MR signal that corresponds to the first scanning SCa1 after the first scanning Sca1 is performed. The receive circuitry 119 generates a digitized second MR signal that corresponds to the second scanning SCa2 after the second scanning Sca2 is performed. The receive circuitry 119 generates a digitized third MR signal that corresponds to the third scanning SCa3 after the third scanning Sca3 is performed.

The processing circuitry 131 that realizes the generation function 1315 generates a first projection image by applying a one-dimensional Fourier transform with respect to a radial direction RD to the first MR signal in the transient response period TRRT of the second scanning Sca2. The processing circuitry 131 generates a second projection image by applying one-dimensional Fourier Transform with respect to a radial direction RD to the second MR signal in the transient response period TRRT of the second scanning Sca2. The first projection image and the second projection image correspond to one-dimensional projection images that are obtained by projecting distribution of spins on a ray that is perpendicular to the radial direction RD on an axis in parallel to the radial direction RD, for example.

The processing circuitry 131 that realizes the determination function 1317 determines the correction coefficients a and T related to the transient response characteristics of the readout gradient magnetic field by a calculating process to minimize a difference between a first image and a second image. Specifically, the processing circuitry 131 generates a differential image by calculating a difference between the first projection image and the second projection image. The processing circuitry 131 calculates a root-mean-square value as a cost function based on a plurality of pixel values in a first projection image and a plurality of pixel values in a projection second image. The processing circuitry 131 determines the correction coefficients a and T using the quasi-Newton method, etc. as a calculating process, so as to minimize a value of the cost function.

The processing circuitry 131 that realizes the correction function 1319 generates a corrected image in which the transient response characteristics are corrected using the third MR signal and the determined correction coefficients. Specifically, the processing circuitry 131 corrects the positions of the sampling points included in the transient response period TRRT among the plurality of sampling points related to the third MR signal in k-space in accordance with the correction coefficients. Subsequently, the processing circuitry 131 generates a corrected image corresponding to the third scanning, using the third MR signals corresponding to the positions of the corrected sampling points and the third MR signals corresponding to the positions of the sampling points that are not included in the transient response period TRRT. The processing circuitry 131 outputs the corrected image to the display 127.

(Operation)

Figure 10:
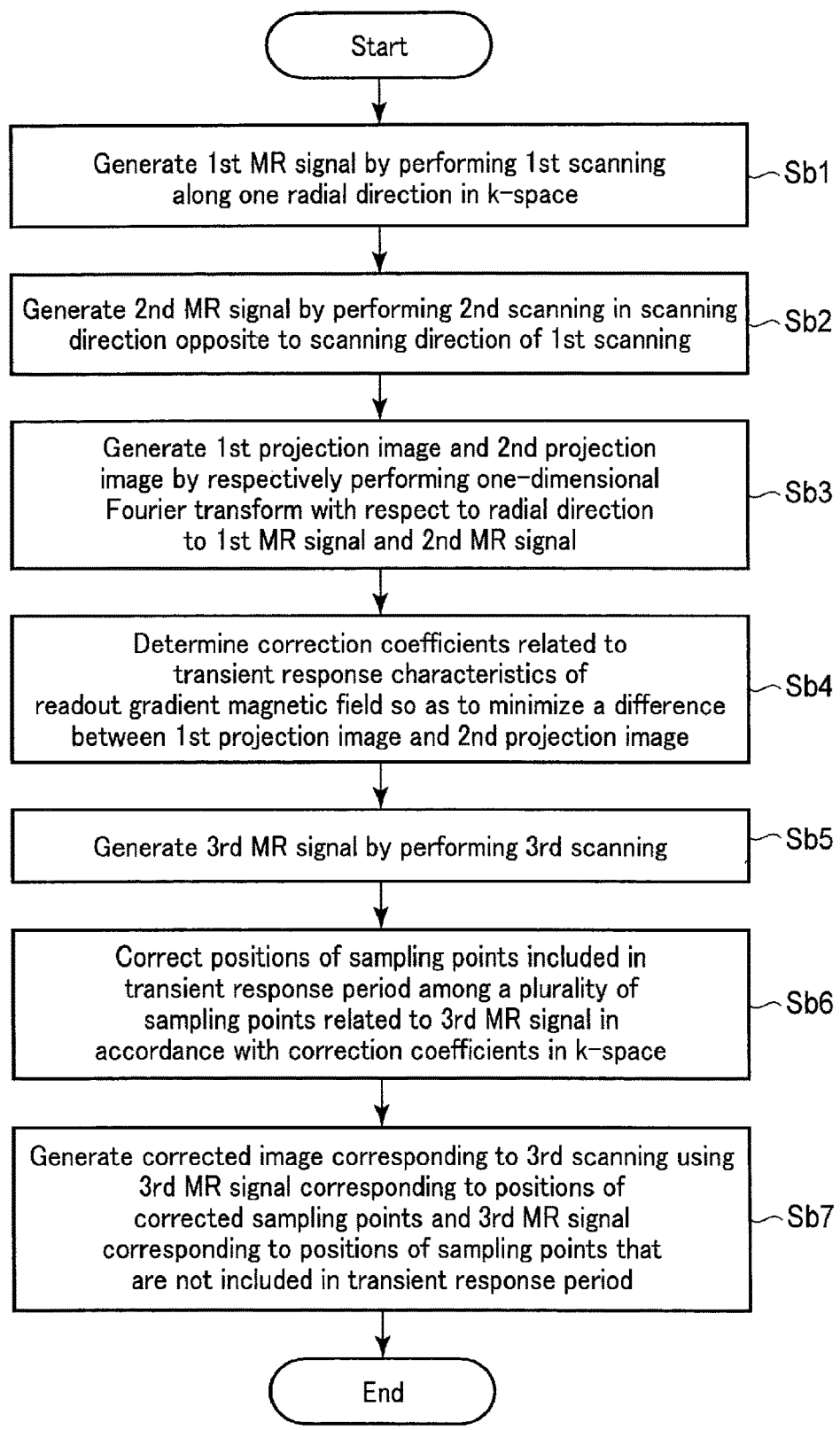
FIG. 10 is a flowchart showing an example of a process of an operation according to the first applied example of the embodiment.

FIG. 10 is a flowchart showing an example of a process of the operation according to the present applied example. An imaging protocol related to the third scanning is determined by an operator's instruction that is input through the interface circuitry 125.

(Step Sb1)

The first scanning Sca1 is performed using a waveform and a bandwidth of a readout gradient magnetic field in a determined imaging protocol, in such a manner that the period FIPE where the readout gradient magnetic field in the first scanning Sca1 is constant includes a low-frequency region, as shown in FIG. 9. A first MR signal is generated by performing the first scanning Sca1.

(Step Sb2)

The second scanning Sca2 is performed using a waveform and a bandwidth of a readout gradient magnetic field in a determined imaging protocol, in such a manner that the transient response period TRRT of the readout gradient magnetic field in the second scan Sca2 is included in the period FIPE, as shown in FIG. 9. A second MR signal is generated by performing the second scanning Sca2.

(Step Sb3)

A first projection image is generated by applying a one-dimensional Fourier transform with respect to the radial direction RD to the first MR signal. A first projection image is a one-dimensional projection image related to the first MR signal that does not include the transient response characteristics. A second projection image is generated by applying the one-dimensional Fourier transform with respect to the radial direction RD to the second MR signal. A second projection image is a one-dimensional projection image related to the second MR signal that include the transient response characteristics.

(Step Sb4)

The correction coefficients a and T related to the transient response characteristics of the readout gradient magnetic field are determined by a calculating process of minimizing a difference between the first projection image and the second projection image. Since a method of determining transient response characteristics is the same as the processing in step Sa4, the explanation thereof is omitted.

(Step Sb5)

The third scanning is performed using the determined imaging protocol, and a third MR signal is generated. The scanning direction in the third scanning is not limited to a radial direction. The processing in step Sb5 may be performed before the processing in step Sb1 through step Sb4.

(Step Sb6)

In k-space, the positions of the sampling points included in the transient response period TRRT among the plurality of sampling points related to the third MR signal are corrected in accordance with the correction coefficients. Since correction of the positions of the sampling points included in the transient response period TRRT is the same as the processing in step Sa5, the explanation thereof is omitted.

(Step Sb7)

A corrected image corresponding to the third scanning is generated, using the third MR signal corresponding to the positions of the corrected sampling points and the third MR signal corresponding to the positions of the sampling points that are not included in the transient response period TRRT.

According to the above-described configuration, the following advantageous effects can be obtained.

According to the magnetic resonance imaging apparatus 100 of the present applied example, first scanning Sca1 and second scanning Sca2 are performed in such a manner that a period FIPE, where the readout gradient magnetic field in the first scanning Sca1 performed in a radial direction RD becomes constant, includes a transient response period TRRT in the second scanning Sca2 in the radial direction RD, third scanning is performed after the first and second scanning, a first projection image is generated based on a first MR signal corresponding to the first scanning Sca1, a second projection image is generated based on a second MR signal corresponding to the second scanning Sca2, correction coefficients related to transient response characteristics of the readout gradient magnetic field are determined by a calculating process to minimize a difference between the first projection image and the second projection image, and a corrected image in which the transient response characteristics are corrected is generated using a third MR signal corresponding to the third scanning and the determined correction coefficients.

Therefore, according to the present magnetic resonance imaging apparatus 100, phase distortion can be corrected using first and second projection images obtained by pre-scanning in one radial direction on a subject P. According to the present magnetic resonance imaging apparatus 100, phase distortion can be thereby corrected if a MR signal in one radial direction RD is obtained; thus, efficiency of a flow of imaging a subject P can be improved. Additionally, according to the present magnetic resonance imaging apparatus 100, transient response characteristics can be determined every time main scanning is performed, thereby generating an image in which artifacts due to phase distortion are reduced even when calibration of phase distortion at the time of installing the apparatus was not performed well. Particularly, according to the present magnetic resonance imaging apparatus 100, in radial scanning where artifacts due to transient response characteristics of a readout gradient magnetic field become significant, an image in which artifacts due to phase distortion are effectively reduced, can be generated.

SECOND APPLIED EXAMPLE

A difference from the first applied example is that first scanning is performed in a first acquisition direction crossing a k-space origin along a predetermined radial direction, and second scanning is performed in a second acquisition direction opposite to the first acquisition direction crossing the origin in the radial direction. The first scanning in the present applied example has a transient response period of a readout gradient magnetic field, unlike the first scanning in the first applied example. In other words, the first scanning and the second scanning of the present applied example have at least one transient response period, that is, a rise period and/or a fall period. An acquisition track of the first scanning and that of the second scanning in k-space have an approximately symmetrical position relationship with respect to the k-space origin.

The sequence control circuitry 121 performs the first scanning and the second scanning in k-space in such a manner that the starting point of the first scanning (hereinafter, the first starting point) and the starting point of the second scanning (hereinafter, the second starting point) are symmetrical with respect to the k-space origin. The sequence control circuitry 121 also performs the first scanning and the second scanning in k-space in such a manner that the ending point of the first scanning (hereinafter, the first ending point) and the ending point of the second scanning (hereinafter, the second ending point) are symmetrical with respect to the k-space origin. The sequence control circuitry 121 performs third scanning related to filling of MR signals in k-space. The third scanning in the present applied example is the same as the third scanning in the first applied example.

Figure 11:
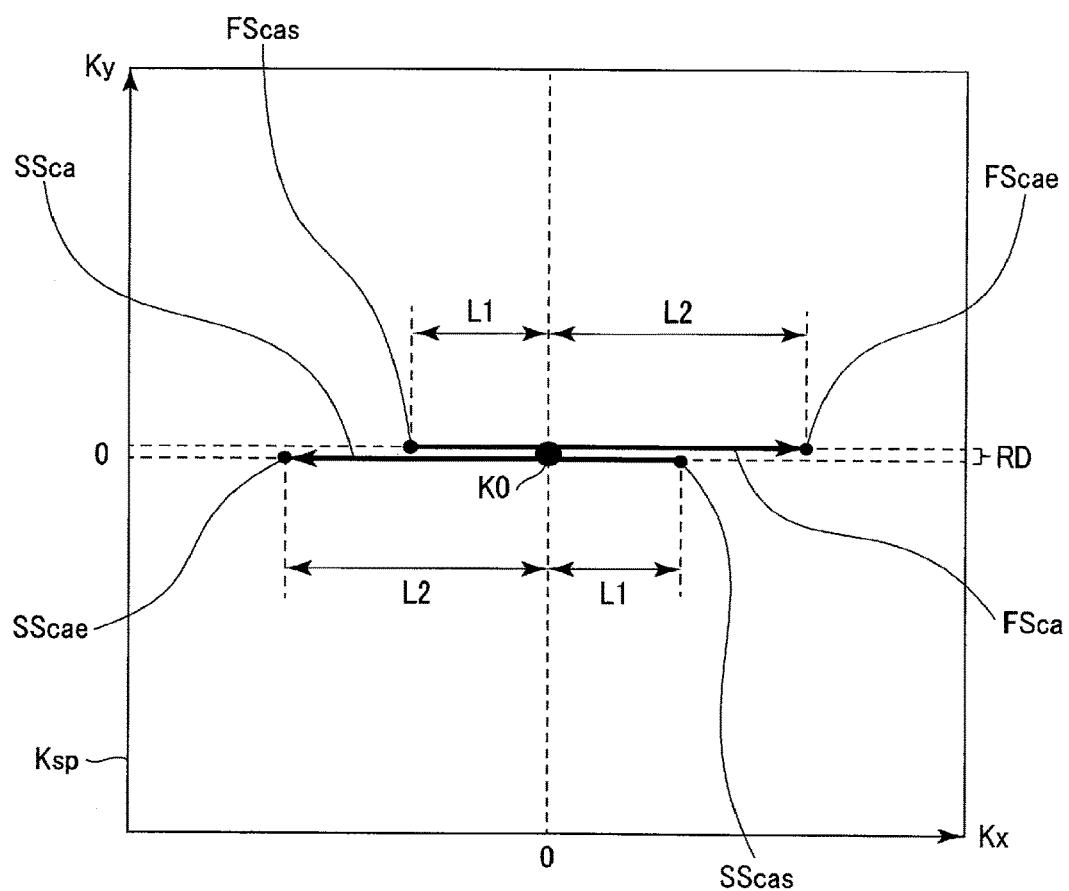
FIG. 11 is an example of first scanning and second scanning in one radial direction in k-space according to a second applied example of the embodiment.

FIG. 11 is a diagram showing an example of the first scanning FSca and the second scanning SSca in k-space Ksp. The radial direction RD in FIG. 11 is located on the axis of ky=0 in k-space, and is depicted with a width to show the scanning directions in the first scanning FSca and the second scanning SSca. As shown in FIG. 11, the first scanning FSca and the second scanning SSCa are performed in opposite acquisition directions along one radial direction RD when the angle θ of the radial direction is 0 degrees. In other words, as shown in FIG. 11, the first acquisition direction of the first scanning Fsca and the second acquisition direction of the second scanning SSca are opposite to each other.

Furthermore, as shown in FIG. 11, the first starting point FScas and the second starting point SScas have a symmetrical position relationship with respect to the k-space origin K0. As shown in FIG. 11, the first ending point FScae and the second ending point SScae have a symmetrical position relationship with respect to the origin K0 of k-space. In other words, as shown in FIG. 11, a distance between the origin K0 of k-space and the first starting point FScas and a distance between the k-space origin K0 and the second starting point SScas are the same distance, L1. In other words, as shown in FIG. 11, a distance between the origin K0 of k-space and the first ending point FScae and a distance between the k-space origin K0 and the second ending point SScae are the same distance, L2.

If a plurality of radial directions are predetermined for the first scanning and the second scanning, the sequence control circuitry 121 performs the first scanning in each of the radial directions including the radial direction RD, and the second scanning in each of the radial directions including the radial direction RD. For example, the first scanning and the second scanning may be performed in each of RD1 having the axis as ky=0 where the angle θ of the radial direction is 0 degrees and RD2 having the axis as kx=0 where the angle θ of the radial direction is 90 degrees.

If both of the first scanning and the second scanning have a transient response period of a readout gradient magnetic field, the distance between the origin K0 in k-space and the first starting point (or the second starting point) may be different between the radial directions. If both of the first scanning and the second scanning have a transient response period of a readout gradient magnetic field, the distance between the k-space origin K0 and the first ending point (or the second ending point) may be different.

FIG. 12 is a diagram showing an example of acquisition tracks of the first scanning FSCa and the second scanning SSca in each of the axes ky=0 and kx=0 as two radial directions. In FIG. 12, the first scanning FSca and the second scanning SSca are performed in the first radial direction RD1 and the second radial direction RD2. As shown in FIG. 12, the distance L1 between the origin K0 and the first starting point FScas1 in the radial direction RD1 and the distance L3 between the origin K0 and the first starting point SScas2 have the same length.

The processing circuitry 131 that realizes the generation function 1315 generates a first projection image by applying a one-dimensional Fourier transform with respect to a radial direction to the first MR signals acquired by the first scanning FSca. The processing circuitry 131 generates a second projection image by applying the one-dimensional Fourier transform with respect to a radial direction to the second MR signals acquired by the second scanning SSca.

If the first scanning FSca and the second SSca are performed in a plurality of radial directions, the processing circuitry 131 that realizes the generation function 1315 generates a first projection image and a second projection image in each of the plurality of radial directions. In other words, the processing circuitry 131 generates a plurality of first projection images respectively corresponding to the plurality of radial directions, including the above-described first projection image in the present applied example. The processing circuitry 131 generates a plurality of second projection images respectively corresponding to the plurality of radial directions, including the above-described second projection image in the present applied example.

The processing circuitry 131 that realizes the determination function 1317 determines the correction coefficients (a and T) related to the transient response characteristics of the readout gradient magnetic field by a calculating process to reduce a difference between the first projection image and the second projection image. Specifically, the processing circuitry 131 generates a differential image by calculating a difference between the first projection image and the second projection image. The processing circuitry 131 calculates, for example, a root-mean-square value as a cost function, using a plurality of pixel values in the differential image. The processing circuitry 131 determines the correction coefficients a and T using the quasi-Newton method, etc. as a calculating process, so as to reduce a value of the cost function.

If the first scanning FSca and the second scanning SSca are performed in a plurality of radial directions, the processing circuitry 131 that realizes the determination function 1317 determines correction coefficients by a calculating process to reduce a plurality of differences obtained by calculating the difference in each of the radial directions. In this case, the multiple differences respectively correspond to the plurality of radial directions.

More specifically, the processing circuitry 131 generates a plurality of differential images by calculating a difference between a first projection image and a second projection image every radial direction. The processing circuitry 131 calculates, for example, a root-mean-square value as a cost function, using a plurality of pixel values in the plurality of differential images. The processing circuitry 131 determines the correction coefficients a and T using the quasi-Newton method, etc. as a calculating process, so as to reduce a value of the cost function.

The processing circuitry 131 that realizes the correction function 1319 generates a corrected image in which the transient response characteristics are corrected using the third MR signal and the determined correction coefficients.

(Operation)

Figure 13:
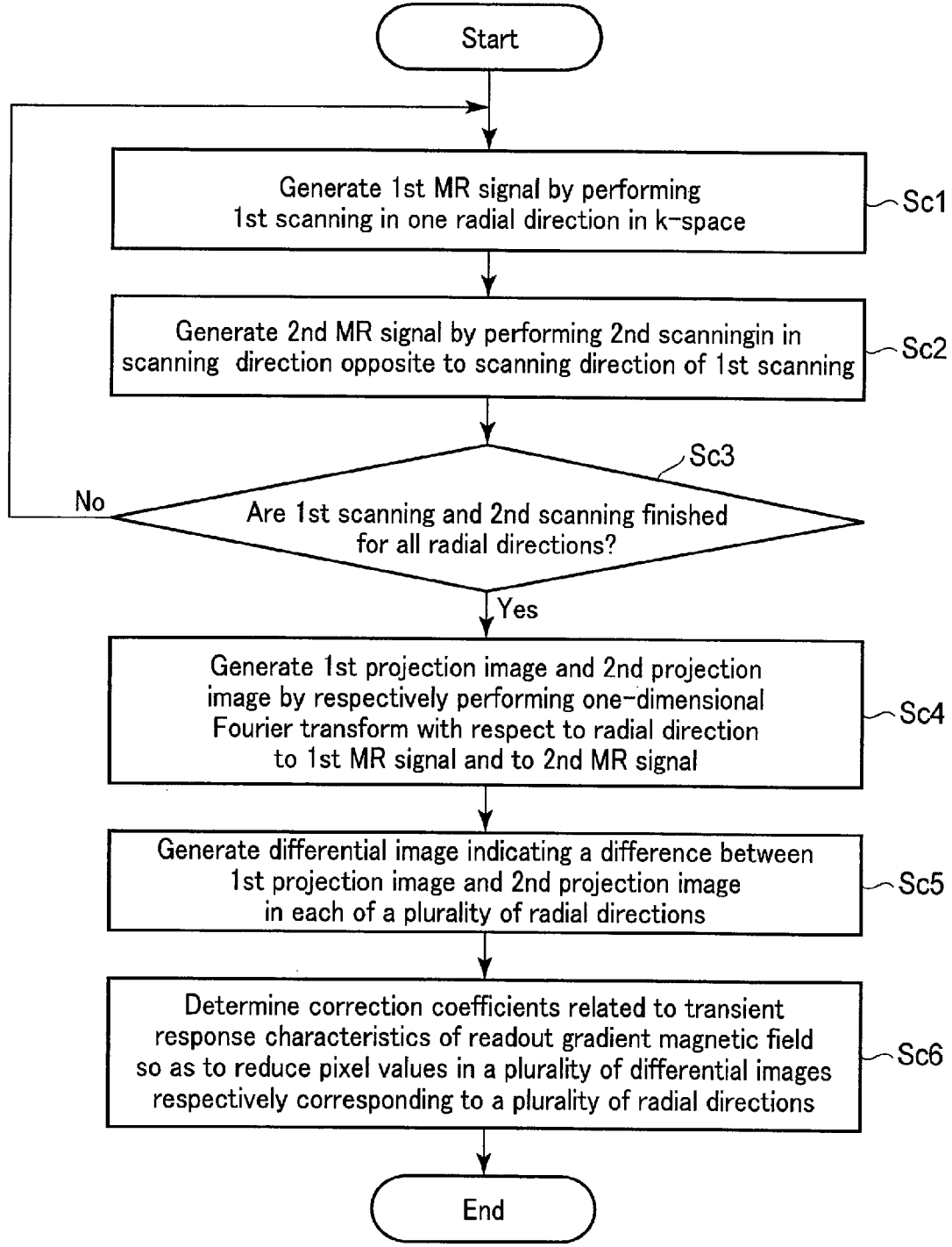
FIG. 13 is a flowchart indicating one example of a process of an operation according to the second applied example of the embodiment.

FIG. 13 is a flowchart showing an example of a process of the operation according to the present applied example. Hereinafter, for purposes of simplicity of explanation, suppose the first scanning FSca and the second scanning SSca are performed in opposite acquisition directions along two radial directions RD where the angles e thereof are 0 degrees and 90 degrees, as shown in FIG. 12. The first scanning FSca and the second scanning SSca maybe performed in one radial direction (0 degrees) as shown in FIG. 11, or may be performed in four directions at the angle θ of 0, 45, 90, and 135 degrees, or in a plurality of other radial directions.

(Step Sc1)

Prior to performing the first scanning FSca and the second scanning SSca, the radial directions related to the first scanning FSca and the second scanning SSca are read from the storage apparatus 129. The first scanning FSca is performed in the radial direction of 0 degrees in k-space. A first MR signal is generated by performing the first scanning FSca. The first MR signal is associated with the radial direction and stored in the storage apparatus 129.

FIG. 14 is a diagram showing an example of a waveform of a first MR signal related to the first scanning FSca and an ideal waveform of a MR signal in a sampling section. As shown in FIG. 14, the first MR signal is delayed for a signal delay amount ds from the signal center that is expected from an ideal MR signal waveform because of the transient response characteristics of a readout gradient magnetic field, particularly, the rise period TRRT of the intensity $G_{ro}$ of a readout gradient magnetic field.

(Step Sc2)

The second scanning SSca is performed in a direction (the second acquisition direction) opposite to the scanning direction of the first scanning FSca (the first acquisition direction) along the radial direction in which the first scanning is performed. A second MR signal is generated by performing the second scanning SSca. The second MR signal is associated with the radial direction and stored in the storage apparatus 129.

FIG. 15 is a diagram showing an example of a second MR signal related to the second scanning SSca in a sampling section. As shown in FIG. 15, the second MR signal is delayed for a signal delay amount ds from the signal center that is expected from an ideal MR signal waveform because of the transient response characteristics of a readout gradient magnetic field, particularly, the rise period TRRT of the intensity $G_{ro}$ of a readout gradient magnetic field.

(Step Sc3)

If the first scanning FSca and the second scanning SSca are not finished in all radial directions, only the processing in step Sc1 and the processing in step Sc2 are repeated. If the first scanning FSca and the second scanning SSca are finished in all radial directions, only the processing in step Sc4 is repeated.

(Step Sc4)

A first projection image and a second projection image respectively corresponding to the plurality of radial directions are generated by performing a one-dimensional Fourier transform with respect to the associated radial directions to the first MR signal and the second MR signal. The first projection image and the second projection image are associated with the radial directions used when performing a one-dimensional Fourier transform and stored in the storage apparatus 129. The processing in this step may be performed after step Sc2.

(Step Sc5)

A differential image of the first projection image and the second projection image is generated for each of the plurality of radial directions. In other words, a plurality of differential images respectively corresponding to the plurality of radial directions are generated by the processing in this step. Each of the differential images is an image to which the signal delay amount ds in the first MR signal shown in FIG. 14 and the signal delay amount ds in the second MR signal are reflected as a phase difference.

(Step Sc6)

The correction coefficients a and T related to the transient response characteristics of the readout gradient magnetic field are determined by a calculating process of reducing a pixel value in the differential image. Since a method of determining transient response characteristics is the same as the processing in step Sa4, the explanation thereof is omitted. In the processing in this step, the correction coefficients are determined so as to reduce the phase difference due to the transient response characteristics of the readout gradient magnetic field, in other words, to eliminate the signal delay amount ds in the first MR signal and the signal delay amount ds in the second MR signal.

The third scanning is performed after the processing in step Sc6, and a third MR signal is generated. The third scanning may be performed before step Sc1. In k-space, the positions of the sampling points included in the transient response period TRRT among the plurality of sampling points related to the third MR signal are corrected in accordance with the correction coefficients. Since correction of the positions of the sampling points included in the transient response period TRRT is the same as the processing in step Sa5, the explanation thereof is omitted. A corrected image corresponding to the third scanning is generated, using the third MR signal corresponding to the positions of the corrected sampling points and the third MR signal corresponding to the positions of the sampling points that are not included in the transient response period TRRT.

The processing in step Sc1 and step Sc2 may be performed along with the third scanning, which is the main scanning. The third scanning may be performed before the processing in step Sc1 and step Sc2. The processing in step Sc4 may be performed using MR signals in two acquisition tracks that are opposite to each other and symmetrical with respect to the k-space origin K0, among the third MR signals acquired by the third scanning. In this case, the processing in step Sc1 and step Sc2 becomes unnecessary.

According to the above-described configuration, the following advantageous effects can be obtained.

According to the magnetic resonance imaging apparatus 100 of the present applied example, first scanning is performed in a first acquisition direction along one radial signal in k-space, crossing the k-space origin, second scanning is performed in a second acquisition direction which is opposite to the first acquisition direction, crossing over the k-space origin along the radial direction, third scanning related to filling of MR signals in k-space is performed, a first projection image is generated by applying a one-dimensional Fourier transform with respect to the radial direction to a first MR signal acquired by the first scanning, a second projection image is generated by applying a one-dimensional Fourier transform to a second MR signal acquired by the second scanning, correction coefficients related to transient response characteristics of a readout gradient magnetic field are determined by a calculating processing to reduce a difference between the first projection image and the second projection image, and a corrected image in which transient response characteristics are corrected using a third MR signal acquired by third scanning and the correction coefficients is generated.

According to the magnetic resonance imaging apparatus 100 of the present applied example, first scanning is performed along each of a plurality of radial directions, second scanning is performed along each of the plurality of radial directions, a plurality of first projection images including a first projection image, respectively corresponding to the plurality of radial directions, a plurality of second projection images including a second projection image, respectively corresponding to the plurality of radial directions, and correction coefficients are determined by a calculating process to reduce a plurality of differences generated by calculating a difference in each of the plurality of radial directions. Furthermore, according to the magnetic resonance imaging apparatus 100, first scanning and second scanning are performed in k-space in such a manner that a starting point of the first scanning and a starting point of the second scanning are symmetrical with respect to the k-space origin, and first scanning and second scanning are performed in k-space in such a manner that an ending point of the first scanning and an ending point of the second scanning are symmetrical with respect to the k-space As described above, according to the present magnetic resonance imaging apparatus 100, phase distortion can be corrected using first and second projection images that are obtained by first scanning and second scanning performed in acquisition directions that are opposite to each other crossing the k-space origin along the same radial direction. Thus, according to the present magnetic resonance imaging apparatus 100, phase distortion can be corrected if a MR signal is acquired in at least one radial direction, thereby improving efficiency of a flow of imaging a subject P. Additionally, according to the present magnetic resonance imaging apparatus 100, transient response characteristics can be determined every time main scanning is performed, thereby generating an image in which artifacts due to phase distortion are reduced even when calibration of phase distortion at the time of installing the apparatus was not performed well. Particularly, according to the present magnetic resonance imaging apparatus 100, in radial scanning where artifacts due to transient response characteristics of a readout gradient magnetic field become significant, an image in which artifacts due to phase distortion are effectively reduced, can be generated.

If the technical idea of the present magnetic resonance imaging apparatus 100 is realized by a medical processing apparatus 135 as a modification of the present embodiment, the medical processing apparatus 135 would include, for example, the constituent elements shown in the dashed line in the configuration diagram of FIG. 1. The medical processing apparatus 135 performs various types of processing using MR signals stored in the storage apparatus 129. For example, the processing in step Sa1 in the flowchart of FIG. 8 would be "read MR signals from the memory apparatus 129". Since advantageous effects achieved by the medical processing apparatus 135 are the same as those achieved by the present embodiment, the description thereof is omitted.

If the technical idea of the present magnetic resonance imaging apparatus 100 is realized by a medical processing apparatus 135 as a modification of the first applied example of the present embodiment, the medical processing apparatus 135 performs various types of processing using a first MR signal, a second MR signal, and a third MR signal stored in the storage apparatus 129. For example, the processing in step Sb1 shown in FIG. 9 would be "read first MR signal from storage apparatus 129", the processing in step Sb2 would be "read second MR signal from storage apparatus 129", and the processing in step Sb5 would be "read third MR signal from storage apparatus 129". Since advantageous effects achieved by the medical processing apparatus 135 are the same as those achieved by the present applied example, the description thereof is omitted.

If the technical idea of the present magnetic resonance imaging apparatus 100 is realized by a medical processing apparatus 135 as a modification of the second applied example of the present embodiment, the medical processing apparatus 135 performs various types of processing using first MR signals, second MR signals, and third MR signals stored in the storage apparatus 129. For example, the processing in step Sc1 shown in FIG. 13 would be "read first MR signal from storage apparatus 129", and the processing in step Sc2 would be "read second MR signal from storage apparatus 129". Since advantageous effects achieved by the medical processing apparatus 135 are the same as those achieved by the present applied example, the description thereof is omitted.

In addition, the arrangement function 1313, the generation function 1315, the determination function 1317, and the correction function 1319, etc. of the present embodiment and the applied examples can also be realized by installing a program (medical processing program) that executes these functions in a computer, such as a work station, and expanding these functions in a memory. In this case, the medical processing program causes a computer to arrange MR signals respectively corresponding to a plurality of sampling points in a readout direction of k-space in accordance with an intensity of the readout gradient magnetic field, to generate a first image using all the MR signals arranged in k-space, to generate a second image using, among all the MR signals, some MR signals corresponding to some sampling points that have a lesser influence due to transient response characteristics, determine correction coefficients related to transient response characteristics of the readout gradient magnetic field by a calculating process to minimize a difference between the first image and the second image, and generate a corrected image in which influence of the transient response characteristics in the first image are corrected using all the MR signals the correction coefficients. The program that causes a computer to execute the above method can be stored and distributed on various types of portable storage medium such as a magnetic disc, an optical disc, or a semiconductor memory.

A magnetic resonance imaging apparatus 100 or a medical processing apparatus 135 according to the above-described embodiment, first applied example, second applied example, and modifications can reduce artifacts.

In the following, a magnetic resonance imaging apparatus and a medical processing apparatus according to the embodiments disclosed in Japanese Patent Application No. 2017-065511, which is a basic application of the present application are described as supplementary.

A magnetic resonance imaging apparatus according to the embodiment includes a sequence control unit, a receiving unit, a generation unit, a determination unit, and a correction unit. The sequence control unit performs first scanning and second scanning in such a manner that a period, where a readout gradient magnetic field in the first scanning in one radial direction in k-space becomes constant, includes a transient response period of the readout gradient magnetic field in the second scanning in the radial direction, and performs third scanning using the readout gradient magnetic field after performing the first scanning and the second scanning. The receiving unit generates a first magnetic resonance signal corresponding to the first scanning and a second magnetic resonance signal corresponding to the second scanning, and generates a third magnetic resonance signal corresponding to the third scanning. The generation unit generates a first projection image by applying a one-dimensional Fourier transform with respect to the radial direction to the first magnetic resonance signal in the transient response period in the second scanning, and generates a second projection image by applying the one-dimensional Fourier transform to the second magnetic resonance signal in the transient response period in the second scanning. The determination unit determines correction coefficients related to the transient response characteristics of the readout gradient magnetic field by a calculating process to minimize a difference between the first projection image and the second projection image. The correcting unit generates a corrected image in which the transient response characteristics are corrected, using the third magnetic resonance signals and the correction coefficients.

The magnetic resonance imaging apparatus according to the embodiment includes an arranging unit, a generation unit, a determination unit, and a correction unit. The arranging unit arranges, in k-space, MR signals respectively corresponding to a plurality of sampling points in accordance with an intensity of a readout gradient magnetic field. The generation unit generates a first image using the magnetic resonance signals arranged in k-space, and generates a second image using some of the MR signals that correspond to sampling points less than the plurality of sampling points. The determination unit determines correction coefficients related to transient response characteristics of the readout gradient magnetic field by a calculating process to minimize a difference between the first image and the second image. The correction unit generates a corrected image in which an influence of the transient response characteristics in the first image, using the correction coefficients.

A medical processing apparatus according to the embodiment includes an arranging unit, a generation unit, a determination unit, and a correction unit. The arranging unit arranges, in k-space, MR signals respectively corresponding to a plurality of sampling points in accordance with an intensity of a readout gradient magnetic field. The generation unit generates a first image using all the magnetic resonance signals arranged in k-space, and generates a second image using some magnetic resonance signals that correspond to some sampling points of the plurality of sampling points. The determination unit determines correction coefficients related to transient response characteristics of the readout gradient magnetic field by a calculating process to minimize a difference between the first image and the second image. The correction unit generates a corrected image in which an influence of the transient response characteristics in the first image, using all the magnetic resonance signals and the correction coefficients.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
   sequence control circuitry that performs first scanning in a first acquisition direction along one radial direction in k-space, crossing over an origin in the k-space, performs second scanning in a second acquisition direction opposite to the first acquisition direction along the radial direction, crossing over the origin, and performs third scanning related to filling of magnetic resonance signals in the k-space; and
   processing circuitry that generates a first projection image by applying a one-dimensional Fourier transform with respect to the radial direction to a first magnetic resonance signal acquired by the first scanning, generates a second projection image by applying the one-dimensional Fourier transform to a second magnetic resonance signal acquired by the second scanning, determines correction coefficients related to transient response characteristics of a readout gradient magnetic field by a calculating process to reduce a difference between the first projection image and the second projection image, and generates a corrected image in which the transient response characteristics are corrected using the correction coefficients and the magnetic resonance signal acquired by the third scanning.

2. The magnetic resonance imaging apparatus according to claim 1, wherein
   the sequence control circuitry performs the first scanning along each of a plurality of radial directions including the radial direction, and performs the second scanning along each of the plurality of radial directions including the radial direction, and
   the processing circuitry
      generates a plurality of first projection images, including the first projection image, that respectively correspond to the plurality of radial directions,
      generates a plurality of second projection images, including the second projection image, that respectively correspond to the plurality of radial directions, and
      determines the correction coefficients by a calculating process to reduce a plurality of differences that are generated by calculating the differences for the plurality of radial directions respectively.

3. The magnetic resonance imaging apparatus according to claim 1, wherein
   the sequence control circuitry performs the first scanning and the second scanning in the k-space in such a manner that a starting point of the first scanning and a starting point of the second scanning are symmetrical with respect to the origin.

4. The magnetic resonance imaging apparatus according to claim 1, wherein
   the sequence control circuitry performs the first scanning and the second scanning in the k-space in such a manner that an ending point of the first scanning and an ending point of the second scanning are symmetrical with respect to the origin.

5. A magnetic resonance imaging apparatus comprising processing circuitry that
   generates a first image using magnetic resonance signals arranged in first sampling points in k-space,
   generates a second image using magnetic resonance signals arranged at second sampling points that are of the number same as or different from the number of the first sampling points and are located differently from the first sampling points in the k-space,
   determines correction coefficients related to transient response characteristics of a readout gradient magnetic field by a calculating process to reduce a difference between the first image and the second image, and
   generates a corrected image in which an influence of the transient response characteristics in the first image is corrected, using the correction coefficients.

6. The magnetic resonance imaging apparatus according to claim 5, wherein the second sampling points are those having a lesser influence due to the transient response characteristics.

7. The magnetic resonance imaging apparatus according to claim 5, wherein
the readout gradient magnetic field is a gradient magnetic field used for radial acquisition for acquiring the magnetic resonance signals along radial directions in the k-space,
the magnetic resonance signals are arranged in the radial directions in the k-space, and
the second sampling points are, among the first sampling points related to the magnetic resonance signals arranged in the radial directions, sampling points that are included in a period except for a rise period of an intensity of the readout gradient magnetic field in a period of applying the readout gradient magnetic field.

8. The magnetic resonance imaging apparatus according to claim 5, wherein
the second sampling points are, among the first sampling points, sampling points included in a period except for the rise period and/or the fall period of the intensity of the readout gradient magnetic field in a period of applying the readout gradient magnetic field.

9. The magnetic resonance imaging apparatus according to claim 5, wherein
the processing circuitry
generates the first image using the magnetic resonance signals arranged in the first sampling points and an initial condition of the transient response characteristics which are based on a waveform of the readout gradient magnetic field according to a pulse sequence and a transient response of at least one gradient coil related to generation of the readout gradient magnetic field, and
determines the correction coefficients by updating the transient response characteristics so as to reduce a root-mean-square value that is calculated based on the difference.

10. The magnetic resonance imaging apparatus according to claim 5, wherein
the processing circuitry generates the corrected image by correcting, in k-space in accordance with the correction coefficients, positions of other sampling points which are the first sampling points except for sampling points included in a range where a first range defined by the first sampling points overlaps with a second range defined by the second sampling points.

11. A medical processing apparatus comprising processing circuitry that
generates a first projection image by applying a one-dimensional Fourier transform with respect to one radial direction in k-space to a first magnetic resonance signal that is acquired in a first acquisition direction along the radial direction, crossing over an origin in the k-space origin;
generates a second projection image by applying the one-dimensional Fourier transform to a second magnetic resonance signal that is acquired in a second acquisition direction opposite to the first acquisition direction along the radial direction, crossing over the origin,
determines correction coefficients related to transient response characteristics of a readout gradient magnetic field by a calculating process to reduce a difference between the first projection image and the second projection image, and
generates a corrected image in which the transient response characteristics are corrected using the correction coefficients and a magnetic resonance signal that is acquired by scanning related to filling of magnetic resonance signals in the k-space.

* * * * *